United States Patent
Aiura et al.

(10) Patent No.: US 9,245,737 B2
(45) Date of Patent: Jan. 26, 2016

(54) LIQUID TREATMENT APPARATUS AND LIQUID TREATMENT METHOD

(71) Applicant: TOKYO ELECTRON LIMITED, Tokyo (JP)

(72) Inventors: Kazuhiro Aiura, Koshi (JP); Norihiro Itoh, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 92 days.

(21) Appl. No.: 14/234,493

(22) PCT Filed: Oct. 11, 2012

(86) PCT No.: PCT/JP2012/076302
§ 371 (c)(1),
(2) Date: Jan. 23, 2014

(87) PCT Pub. No.: WO2013/054838
PCT Pub. Date: Apr. 18, 2013

(65) Prior Publication Data
US 2014/0248774 A1     Sep. 4, 2014

(30) Foreign Application Priority Data

Oct. 13, 2011   (JP) .................................. 2011-225974

(51) Int. Cl.
*H01L 21/461* (2006.01)
*H01L 21/02* (2006.01)
(Continued)

(52) U.S. Cl.
CPC .... *H01L 21/02076* (2013.01); *H01L 21/30604* (2013.01); *H01L 21/6708* (2013.01); *H01L 21/6719* (2013.01); *H01L 21/67051* (2013.01); *H01L 21/67075* (2013.01)

(58) Field of Classification Search
CPC .................. H01L 21/02076; H01L 21/30604; H01L 21/67051; H01L 21/67075

USPC ........ 438/745, 747, 748; 156/345.11, 345.17, 156/345.21, 345.23
See application file for complete search history.

(56) References Cited

U.S. PATENT DOCUMENTS

2008/0006299 A1 * 1/2008 Orii ................... H01L 21/67051
                                                    134/10
2008/0083501 A1 * 4/2008 Arai .................... H01L 21/6708
                                                    156/345.21
(Continued)

FOREIGN PATENT DOCUMENTS

JP      2003-297788 A1   10/2003
JP      2007-035866 A1    2/2007
(Continued)

OTHER PUBLICATIONS

International Search Report dated Jan. 8, 2013.

*Primary Examiner* — Binh X Tran
(74) *Attorney, Agent, or Firm* — Burr & Brown, PLLC

(57) ABSTRACT

The liquid treatment apparatus according to the present invention includes a substrate holder configured to horizontally hold a substrate, and a top plate configured to be rotatable and to cover the substrate held by the substrate holder from above so as to define a treatment space. In the treatment space, a chemical liquid is supplied by a chemical liquid nozzle onto the substrate, and an atmosphere replacement gas is supplied by a replacement nozzle into the treatment space. The replacement nozzle is supported by a replacement nozzle support arm configured to be horizontally moved between an advanced position at which the replacement nozzle support arm is advanced into the treatment space and a retracted position at which the replacement nozzle support arm is retracted outside from the treatment space. The replacement nozzle is configured to discharge, above the substrate, the atmosphere replacement gas upward.

15 Claims, 16 Drawing Sheets

(51) Int. Cl.
*H01L 21/67* (2006.01)
*H01L 21/306* (2006.01)

(56) References Cited

U.S. PATENT DOCUMENTS

| | | | | |
|---|---|---|---|---|
| 2009/0202951 | A1* | 8/2009 | Yamamoto | G03F 7/168 430/322 |
| 2010/0144158 | A1* | 6/2010 | Ito | H01L 21/67051 438/758 |
| 2011/0226626 | A1* | 9/2011 | Choi | C25D 17/06 205/93 |
| 2011/0240601 | A1* | 10/2011 | Hashizume | H01L 21/02063 216/83 |
| 2012/0014689 | A1* | 1/2012 | Ookouchi | H01L 21/67051 396/611 |
| 2012/0100727 | A1* | 4/2012 | Nagaseki | H01L 21/02126 438/786 |
| 2012/0131815 | A1* | 5/2012 | Kraus | F17C 9/00 34/443 |

FOREIGN PATENT DOCUMENTS

| | | |
|---|---|---|
| JP | 2009-218404 A1 | 9/2009 |
| JP | 2011-054823 A1 | 3/2011 |

* cited by examiner

LIQUID TREATMENT APPARATUS AND LIQUID TREATMENT METHOD

TECHNICAL FIELD

The present invention relates to a liquid treatment apparatus and a liquid treatment method that perform predetermined liquid treatments to a substrate, such as a cleaning treatment and an etching treatment, by supplying a treatment liquid to the substrate while rotating the substrate held in a horizontal posture.

BACKGROUND ART

In a semiconductor device manufacturing process, a resist film having a predetermined pattern is formed on a process target film which is formed on a substrate such as a semiconductor wafer (hereinafter referred to also as "wafer"), and the process target film is subjected to a treatment such as etching or ion implantation using the resist film as a mask. After the treatment, the unnecessary resist film is removed from the wafer.

An SPM treatment is typically used as a method for removing the resist film. The SPM treatment is performed by supplying the resist film with an SPM solution (Sulfuric Acid Hydrogen Peroxide Mixture) obtained by mixing sulfuric acid and hydrogen peroxide solution.

In the SPM treatment, the SPM solution of a high temperature is generally discharged toward a wafer. Thus, the SPM solution may evaporate to generate fume. There is a possibility that the fume might diffuse in a wide area of a chamber of a resist removal apparatus to contaminate an inner wall of the chamber and components therein so that a wafer contamination causative agent is generated.

In order to prevent that the fume diffuses in a wide area of the chamber to contaminate the inner wall of the chamber and the components therein, JP2007-35866A proposes a resist removal apparatus including: a spin chuck configured to hold a wafer, a shield wall surrounding a circumference of the wafer held by the spin chuck, the shield wall having an opening above the wafer; a shield plate disposed above the shield wall; and a nozzle configured to be inserted from a lateral side through a gap between the shield wall and the shield plate so as to discharge an SPM solution toward the wafer. According to the resist removal apparatus described in JP2007-35866A, the shield wall and the shield plate can prevent fume from diffusing in a wide area in the chamber.

SUMMARY OF THE INVENTION

However, in the resist removal apparatus described in JP2007-35866A, the fume may remain in a space defined by the shield wall and the shield plate, even after the SPM treatment has been finished. Thus, in a rinse treatment step posterior to the SPM treatment, the fume is removed from the space by forming a downward gas flow running from above by nitrogen gas. However, in such a method, a replacement efficiency of an atmosphere in the space is low, and it is difficult to carry out a sufficient replacement. Namely, in order that the space is opened for the succeeding step, the fume should be removed beforehand from the space. However, it takes a long time to eliminate the fume because of the low replacement efficiency.

The present invention has been made in view of such a respect. The object of the present invention is to provide a liquid treatment apparatus and a liquid treatment method that can improve a replacement efficiency of an atmosphere after a chemical liquid treatment.

The present invention provides a liquid treatment apparatus comprising: a substrate holder configured to horizontally hold a substrate; a top plate configured to be rotatable and to cover the substrate held by the substrate holder from above so as to define a treatment space; a chemical liquid nozzle configured to supply a chemical liquid to the substrate in the treatment space; a replacement nozzle configured to supply an atmosphere replacement gas into the treatment space; and a replacement nozzle support arm configured to support the replacement nozzle and configured to be horizontally moved between an advanced position at which the replacement nozzle support arm is advanced into the treatment space and a retracted position at which the replacement nozzle support arm is retracted outside from the treatment space; wherein the replacement nozzle is configured to discharge, above the substrate, the atmosphere replacement gas upward.

The present invention provides a liquid treatment apparatus comprising: a substrate holder configured to horizontally hold a substrate; a substrate rotary drive unit configured to rotate the substrate holder; a top plate configured to be rotatable and to cover the substrate held by the substrate holder from above so as to define a treatment space; a chemical liquid nozzle configured to supply a chemical liquid to the substrate in the treatment space; a replacement nozzle configured to supply an atmosphere replacement gas into the treatment space; and a replacement nozzle support arm configured to support the replacement nozzle and configured to be horizontally moved between an advanced position at which the replacement nozzle support arm is advanced into the treatment space and a retracted position at which the replacement nozzle support arm is retracted outside from the treatment space; wherein the replacement nozzle is configured to discharge, above the substrate, the atmosphere replacement gas horizontally in a rotating direction of the substrate.

The present invention provides a liquid treatment method comprising: holding a substrate in a horizontal posture; covering an upper part of the held substrate with a top plate so as to define a treatment space; rotating the top plate after having defining the treatment space; performing a chemical liquid treatment onto the substrate by supplying a chemical liquid to the substrate in the treatment space; moving a replacement nozzle configured to supply an atmosphere replacement gas into the treatment space where the chemical liquid treatment has been performed, from a position that is retracted outside from the treatment space to a position that is advanced into the treatment space; and supplying the atmosphere replacement gas into the treatment space from the replacement nozzle that has advanced into the treatment space so as to replace an atmosphere in the treatment space with the atmosphere replacement gas.

According to the liquid treatment apparatus and the liquid treatment method of the present invention, a replacement efficiency of an atmosphere after a chemical liquid treatment can be improved.

EMBODIMENTS FOR CARRYING OUT INVENTION

Hereinafter, embodiments of the present invention will be described with reference to the accompanying drawings.

(First Embodiment)

Figure 1:
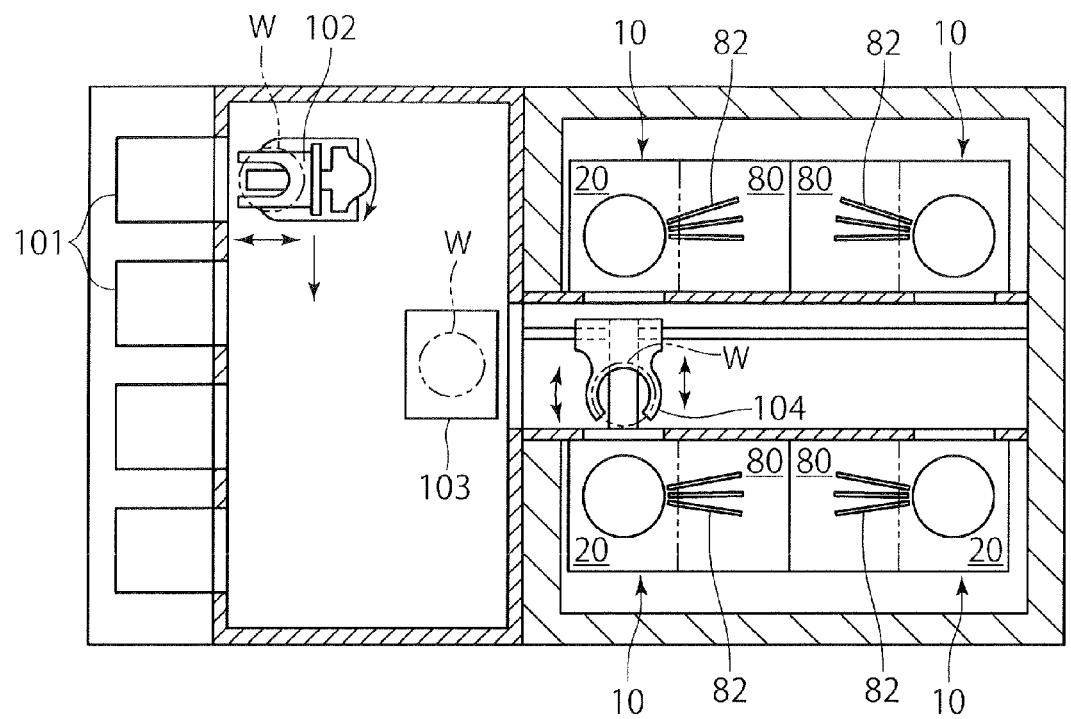
FIG. 1 is a top view, seen from above, of a liquid treatment system that includes a liquid treatment apparatus in a first embodiment of the present invention.

First, a liquid treatment system that includes a liquid treatment apparatus in a first embodiment of the present invention is described with reference to FIG. 1. As shown in FIG. 1, the liquid treatment system includes: stages 101 for placement of carriers which are transferred from the outside of the system, and each of which stores a substrate W such as a semiconductor wafer (hereinafter referred to also as "wafer W") as a substrate to be treated; a carrying arm 102 that takes out the wafers W stored in the carriers; a shelf unit 103 on which the wafers W thus taken out by the carrying arm 102 are placed; and a carrying arm 104 that receives the wafers W placed on the shelf unit 103 and transfers the wafers W into a liquid treatment apparatus 10. As shown in FIG. 1, a plurality of (four, in the embodiment of FIG. 1) the liquid treatment apparatuses 10 are arranged in the liquid treatment system.

Next, the schematic configuration of the liquid treatment apparatus 10 is described with reference to FIGS. 2 to 4.

Figure 2:
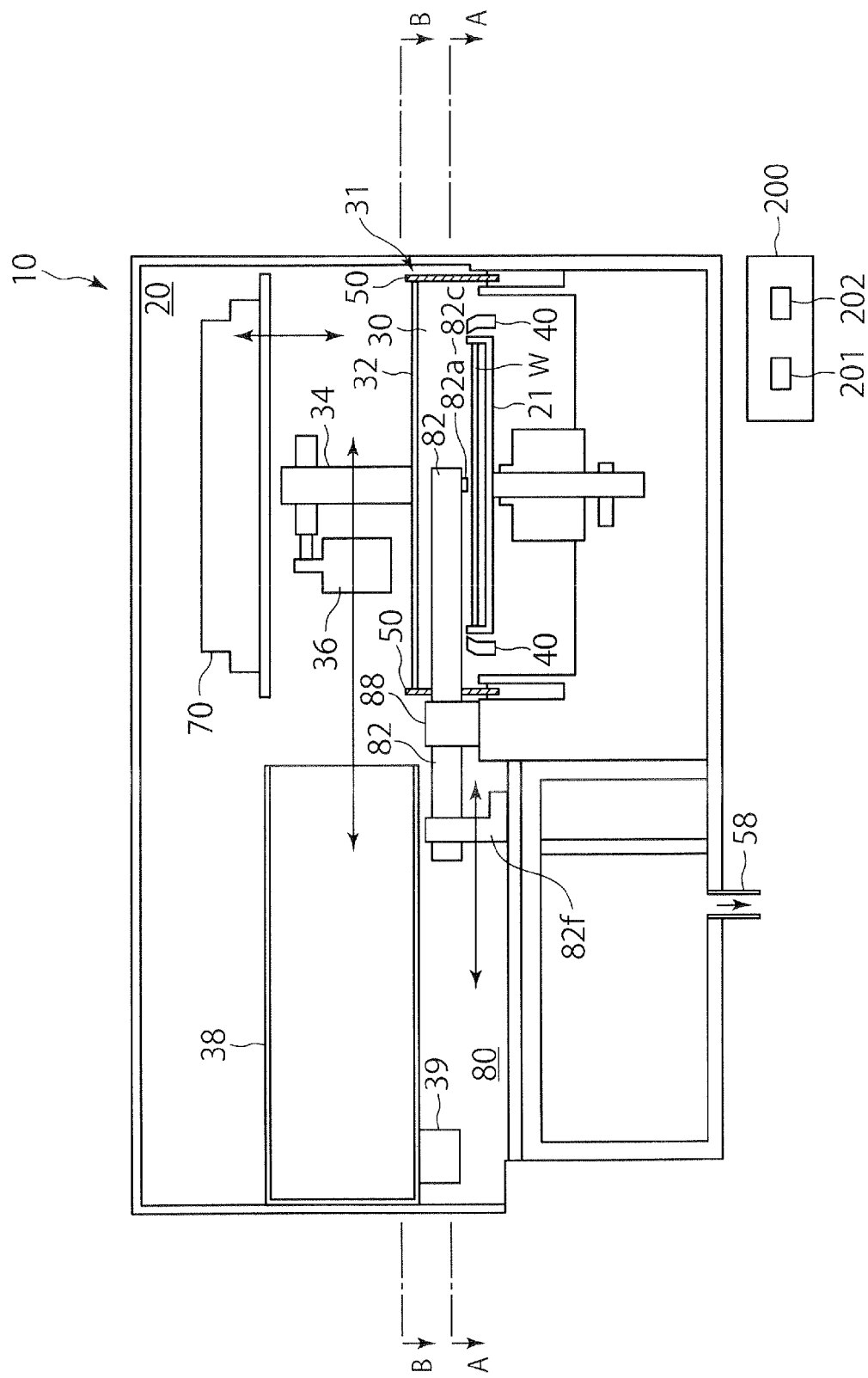
FIG. 2 is a side view of the liquid treatment apparatus in the first embodiment of the present invention.
Figure 3:
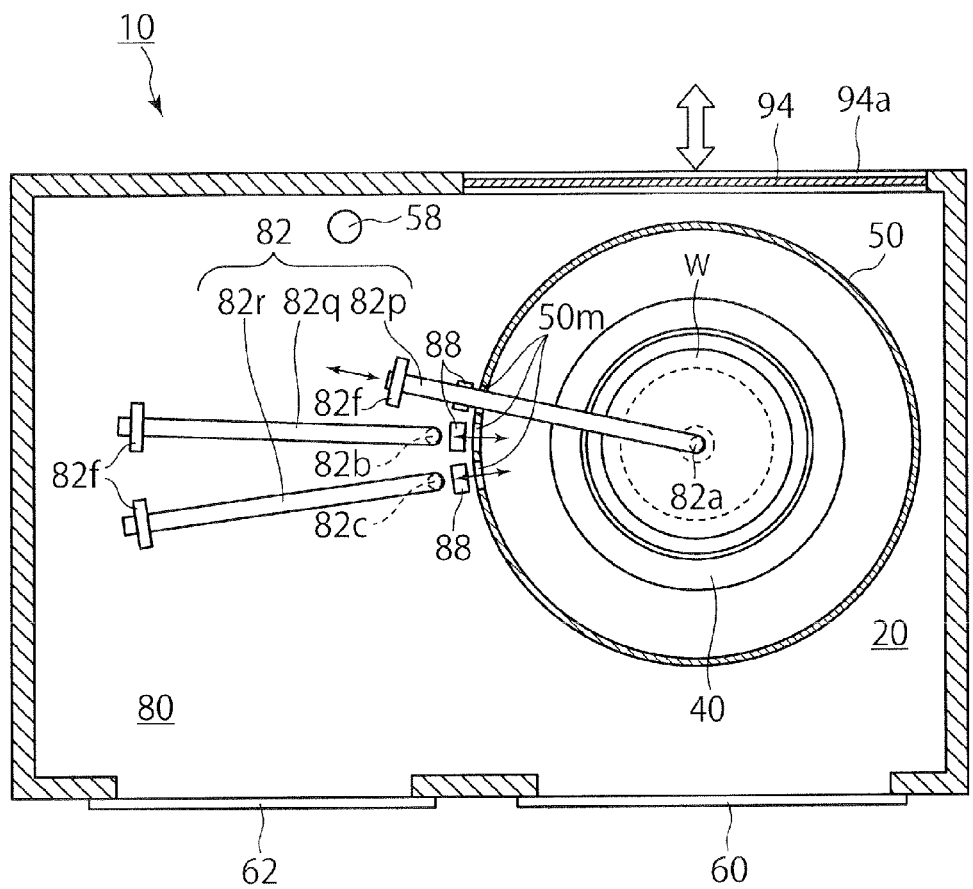
FIG. 3 is a top view of the liquid treatment apparatus, taken along a line A-A shown in FIG. 2.
Figure 4:
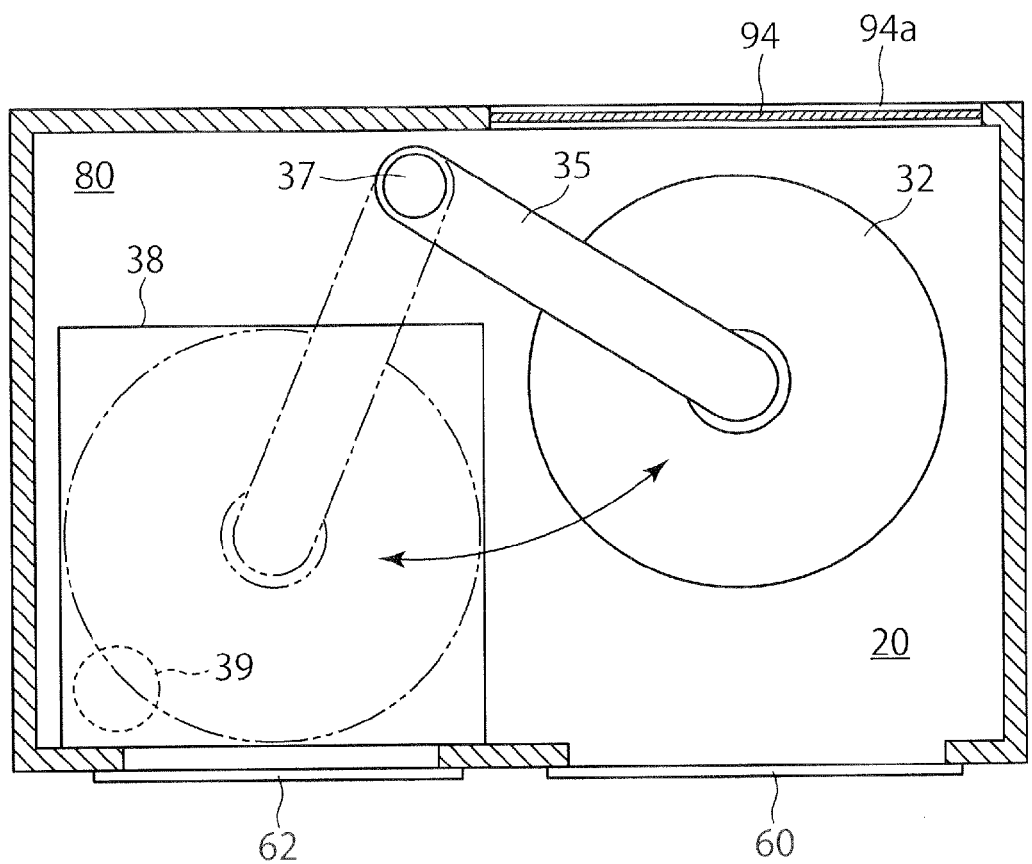
FIG. 4 is a top view of the liquid treatment apparatus, taken along a line B-B shown in FIG. 2.

As shown in FIGS. 2 to 4, the liquid treatment apparatus 10 in this embodiment includes: a chamber 20 in which a wafer W is contained and a liquid treatment is performed to the contained wafer W; and a standby area 80 located adjacent to the chamber 20. The liquid treatment apparatus 10 in this embodiment does not have a partitioning wall for separating the chamber 20 and the standby area 80 from each other, and the chamber 20 and the standby area 80 are thus communicated with each other. As shown in FIG. 2, a substrate holder 21 is arranged in the chamber 20 to rotate the wafer W while holding the wafer W in a horizontal posture. A ring-shaped rotary cup 40 is provided around the wafer W held by the substrate holder 21 in a radial direction of the wafer W. The rotary cup 40 is disposed for receiving a treatment liquid which has been supplied to the wafer W in the liquid treatment performed to the wafer W. As shown in FIGS. 2 and 3, a cylindrical outer cup 50 is arranged around the rotary cup 40 in a radial direction thereof in the chamber 20. As described below, the cylindrical outer cup 50 is configured to be moved up and down depending on the treatment condition of the wafer W. Detailed configurations of the substrate holder 21, the rotary cup 40 and the cylindrical outer cup 50 are described later.

As shown in FIG. 2, the liquid treatment apparatus 10 includes nozzles (advancing/retracting nozzles) 82a to 82c that supply a treatment liquid or an atmosphere replacement gas described below, and nozzle support arms 82 that hold the nozzles 82a to 82c. As shown in FIG. 3, one liquid treatment apparatus 10 includes a plurality of the nozzle support arms 82 (specifically, three nozzle support arms, for example). The nozzles 82a to 82c are arranged on the tip portions of the nozzle support arms 82, respectively. As shown in FIGS. 2 and 3, an arm supporter 82f is provided on each nozzle support arm 82. The arm supporter 82f is driven by a not-shown driving mechanism in a right and left direction in FIG. 2. Thus, each nozzle support arm 82 moves linearly in a horizontal direction between an advanced position at which the nozzle support arm 82 advances into the cylindrical outer cup 50 through a side opening 50m (described later) and a retracted position at which the nozzle support arm 82 is retracted outside from the cylindrical outer cup 50 (refer to arrows of the nozzle support arms 82 in FIGS. 2 and 3).

As shown in FIGS. 2 and 4, a top plate 32, for covering the wafer W held by the substrate holder 21 from above, is arranged so as to be movable in the horizontal direction. More specifically, the top plate 32 reciprocately moves between an advanced position that is indicated by a solid line shown in FIG. 4 and at which the top plate 32 covers the wafer W held by the substrate holder 21 from above, and a retracted position that is indicated by two-dot chain lines shown in FIG. 4 and at which the top plate 32 is retracted from the advanced position in the horizontal direction and then located. A detailed configuration of the top plate 32 is described later.

As shown in FIG. 2, a treatment space defining body 31, which defines a treatment space 30 covering the wafer W held by the substrate holder 21, is provided in the chamber 20. In this embodiment, the treatment space defining body 31 includes the aforementioned top plate 32 and the cylindrical outer cup 50. Namely, the treatment space 30 is defined by the top plate 32 and the cylindrical outer cup 50. In the treatment space 30, the nozzles 82a to 82c supply the treatment liquid or the atmosphere replacement gas.

As shown in FIG. 2, an air hood 70 for covering the wafer W held by the substrate holder 21 from above is arranged so as to be movable up and down. $N_2$ gas (nitrogen gas) and cleaned gas such as clean air flow down from the air hood 70. More specifically, the air hood 70 is capable of moving up and down between a lowered position at which the air hood 70 covers the wafer W held by the substrate holder 21 from above and a lifted position located above the lowered position. FIG. 2 shows a state in which the air hood 70 is located at the lifted position. A detailed configuration of the air hood 70 is described later.

As shown in FIGS. 2 and 3, an evacuation unit 58 is provided at a bottom part of the standby area 80 arranged on the outer side of the cylindrical outer cup 50. An atmosphere in the standby area 80 is evacuated via the evacuation unit 58. Specifically, particles generated by the driving mechanism (not shown) for driving the respective nozzle support arms 82 can be evacuated by the evacuation unit 58.

As shown in FIGS. 3 and 4, shutters 60 and 62 are arranged at openings for maintenance of the chamber 20 and the standby area 80 of the liquid treatment apparatus 10. Since the shutters 60 and 62 for maintenance are arranged for the chamber 20 and the standby area 80, respectively, devices within the chamber 20 and devices within the standby area 80 can be individually maintained.

As shown in FIG. 3, a side wall of the liquid treatment apparatus 10 is provided with an opening 94a through which the wafer W is loaded into and unloaded from the chamber 20 by the carrying arm 104. A shutter 94 for opening and closing the opening 94a is disposed at the opening 94a.

Next, details of the constituent elements of the liquid treatment apparatus 10 shown in FIGS. 2 to 4 are described with reference to FIGS. 5 to 8.

Figure 5:
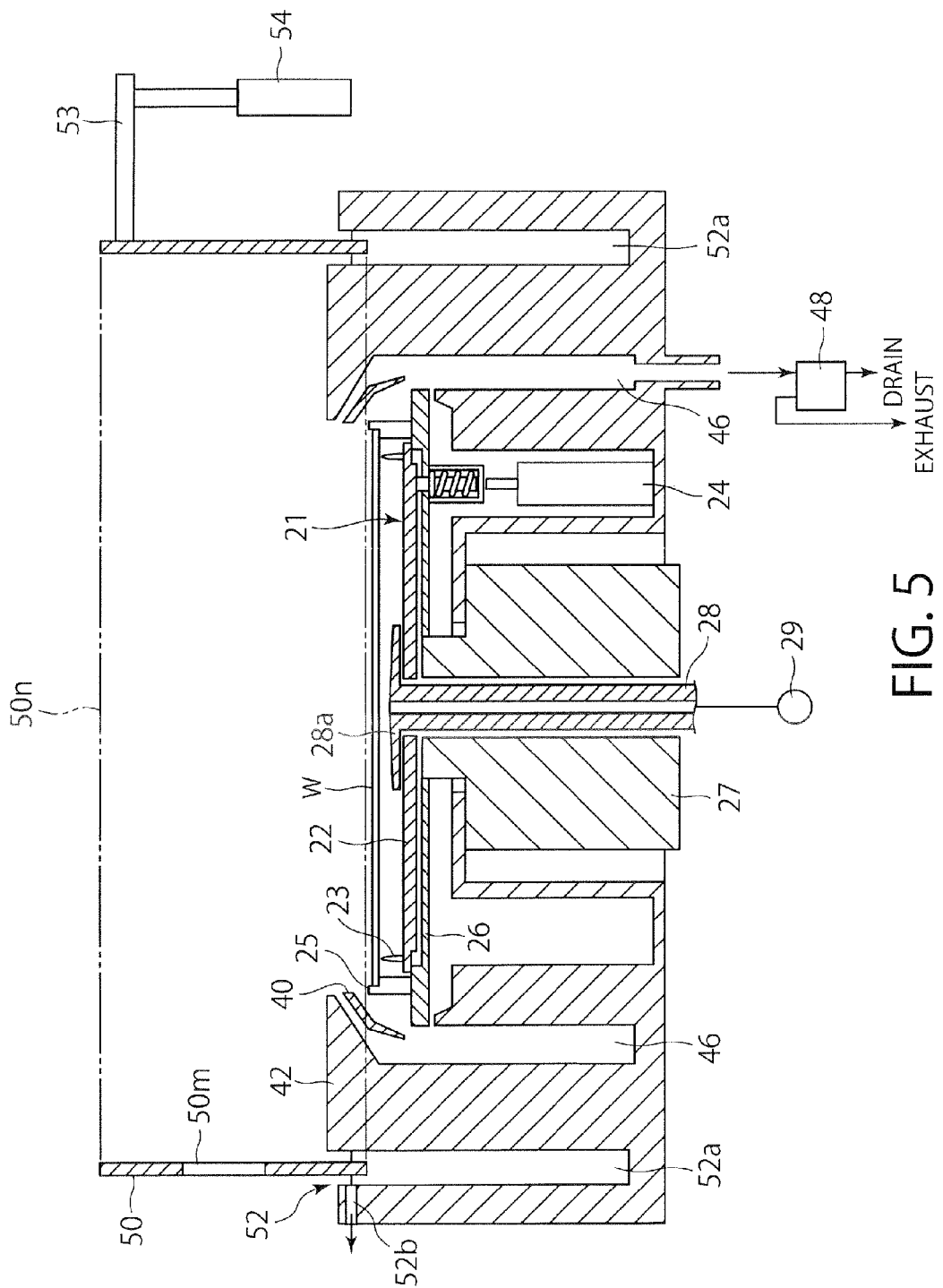
FIG. 5 is a vertical cross-sectional view of a substrate holder included in the liquid treatment apparatus shown in FIG. 2 and constituent elements located near the substrate holder.

First, the substrate holder 21 is described with reference to FIG. 5. FIG. 5 is a vertical cross-sectional view of the substrate holder 21 and constituent elements of the liquid treatment apparatus 10 located near the substrate holder 21.

As shown in FIG. 5, the substrate holder 21 has a disk-shaped holding plate 26 for holding the wafer W and a disk-shaped lift pin plate 22 disposed over the holding plate 26. Three lift pins 23 for supporting the wafer W from below are arranged on an upper surface of the lift pin plate 22 at equal intervals therebetween in the circumferential direction. FIG. 5 shows only two of the lift pins 23. A piston mechanism 24 is arranged under the lift pin plate 22, which is moved up and down by the piston mechanism 24. More specifically, in order for the carrying arm 104 (refer to FIG. 1) to place the wafer W on the lit pins 23 or retrieve the wafer W from the lift pins 23, the lift pin plate 22 is moved up by the piston mechanism 24 from the position shown in FIG. 5, so that the lift pin plate 22 is positioned above the rotary cup 40. On the other hand, when a liquid treatment, a drying treatment or the like are performed to the wafer W in the chamber 20, the lift pin plate 22 is moved down to the lowered position shown in FIG. 5 by the piston mechanism 24, so that the rotary cup 40 is located around the wafer W.

The holding plate 26 has three holding members 25 arranged at equal intervals therebetween in the circumferential direction to hold the wafer W from the lateral side. FIG. 5 illustrates only two of the holding members 25. When the lift pin plate 22 is moved from the lifted position to the lowered position shown in FIG. 5, the holding members 25 hold the wafer W on the lift pins 23 from the lateral side, such that the wafer W is taken slightly apart from the lift pins 23.

The lift pin plate 22 and the holding plate 26 each have a through-hole at a central portion thereof, and a treatment liquid supply pipe 28 extends through the through-holes. Treatment liquids of various types, such as a chemical liquid and a deionized water, are supplied through the treatment liquid supply pipe 28 to a back surface of the wafer W held by the holding members 25 of the holding plate 26. The treatment liquid supply pipe 28 moves up and down together with the lift pin plate 22. A head portion 28a is formed on an upper end of the treatment liquid supply pipe 28 so as to close the through-hole of the lift pin plate 22. As shown in FIG. 5, a treatment liquid supply unit 29 is connected to the treatment liquid supply pipe 28. The treatment liquids of various types are supplied from the treatment liquid supply unit 29 to the treatment liquid supply pipe 28.

The ring-shaped rotary cup 40 is attached to the holding plate 26 so that the rotary cup 40 is connected to the holding plate 26 by a connection member, not shown. The holding plate 26 is connected to a substrate rotary drive unit 27. The rotary cup 40 is rotated integrally with the holding plate 26. As shown in FIG. 5, the rotary cup 40 is disposed to surround the wafer W held by the respective holding members 25 of the holding plate 26 from the lateral side of the wafer W. Thus, the rotary cup 40 can receive a treatment liquid scattering laterally from the wafer W during the liquid treatment performed to the wafer W.

A drain cup 42 is arranged around the rotary cup 40. The drain cup 42 is formed in a ring shape. The drain cup 42 has an opening at an upper portion thereof. The position of the drain cup 42 is fixed in the chamber 20.

As shown in FIG. 5, an exhaust unit 46 that discharges an atmosphere in the treatment space 30 is disposed below the drain cup 42. To be specific, a predetermined treatment liquid scattering laterally from the wafer W, e.g., an SPM solution or a deionized water described below, is delivered, together with the atmosphere in the treatment space 30, to the exhaust unit 46. As shown in FIG. 5, a gas-liquid separator 48 is connected to the exhaust unit 46. As shown in FIG. 5, the treatment liquid and the gas delivered from the exhaust unit 46 are separated by the gas-liquid separator 48 so as to be drained and exhausted.

In the liquid treatment apparatus 10 in this embodiment, the cylindrical outer cup 50 is arranged around the drain cup 42, within the chamber 20. As shown in FIG. 5, a support member 53 for supporting the cylindrical outer cup 50 is coupled to an upper portion of the cylindrical outer cup 50, and a vertically driving mechanism 54 for moving up and down the support member 53 is provided on the support member 53. The support member 53 is moved up and down by the vertically driving mechanism 54 whereby the cylindrical outer cup 50 can move up and down between a lifted position at which an upper edge of the cylindrical outer cup 50 is located above the rotary cup 40 and a lowered position located under the lifted position, as shown in FIG. 5. As shown in FIGS. 3 and 5, a plurality of the side openings 50m through which the nozzle support arms 82 can pass are formed in a side surface of the cylindrical outer cup 50. As shown in FIG. 5, the cylindrical outer cup 50 has an upper opening 50n formed in an upper portion thereof. When the cylindrical outer cup 50 is located at the lifted position and the top plate 32 is located at the advanced position, the upper opening 50n is closed by the top plate 32.

As shown in FIG. 5, a cleaning unit 52 for cleaning the cylindrical outer cup 50 is arranged in the chamber 20. The cleaning unit 52 has a reservoir unit 52a for containing a cleaning liquid such as a deionized water. When the cylindrical outer cup 50 is located at the lowered position, the cylindrical outer cup 50 is immersed in the cleaning liquid contained in the reservoir unit 52a. When the cylindrical outer cup 50 is immersed in the cleaning liquid contained in the reservoir unit 52a, the cylindrical outer cup 50 is cleaned by the cleaning unit 52.

A not-shown cleaning liquid supply pipe is connected to the reservoir unit 52a. The cleaning liquid is continuously supplied to the reservoir unit 52a through the cleaning liquid supply pipe. A drain pipe 52b is installed in a side part of the reservoir unit 52a. The cleaning liquid contained in the reservoir unit 52a is drained through the drain pipe 52b. Namely, by continuously supplying the cleaning liquid to the reservoir unit 52a through the cleaning liquid supply pipe and by discharging the cleaning liquid in the reservoir unit 52a through the drain pipe 52b, the cleaning liquid contained in the reservoir unit 52a is cleaned.

As shown in FIG. 3, in this embodiment, each liquid treatment apparatus 10 has a plurality of (specifically, three, for example) the nozzle support arms 82, at the tip portions of which are provided with the nozzles 82a to 82c. As shown in FIG. 2, each nozzle support arm 82 is provided with the arm supporter 82f. The arm supporter 82f is driven in the right and left direction in FIG. 2 by the driving mechanism, not shown. Thus, each nozzle support arm 82 is linearly moved in the horizontal direction between the advanced position at which the nozzle support arm 82 is advanced through the corresponding side opening 50m into the cylindrical outer cup 50, and the retracted position at which the nozzle support arm 82 is retracted from the cylindrical outer cup 50 (refer to the arrows of the nozzle support arm 82 shown in FIGS. 2 and 3). When the nozzle support arm 82 is moved to the advanced position, the nozzle 82a to 82c is located at an advanced position in the cylindrical outer cup 50 so as to be positioned above the wafer W. On the other hand, when the nozzle support arm 82 is moved to the retracted position, the nozzle 82a to 82c is located at a position retracted from the cylindrical outer cup 50.

As shown in FIGS. 2 and 3, an arm cleaning unit 88 is arranged in the liquid treatment apparatus 10. The arm cleaning unit 88 is configured to clean each nozzle support arm 82. To be more specific, the position of the arm cleaning unit 88 is fixed, and a reservoir unit (not shown) containing a cleaning liquid is provided in the arm cleaning unit 88. During the movement of the nozzle support arm 82 from the advanced position to the retracted position or the movement thereof from the retracted position to the advanced position, while a part of the nozzle support arm 82 is brought into contact with the cleaning liquid contained in the reservoir unit, the nozzle support arm 82 is moved, so that the nozzle support arm 82 is cleaned.

Figure 8:
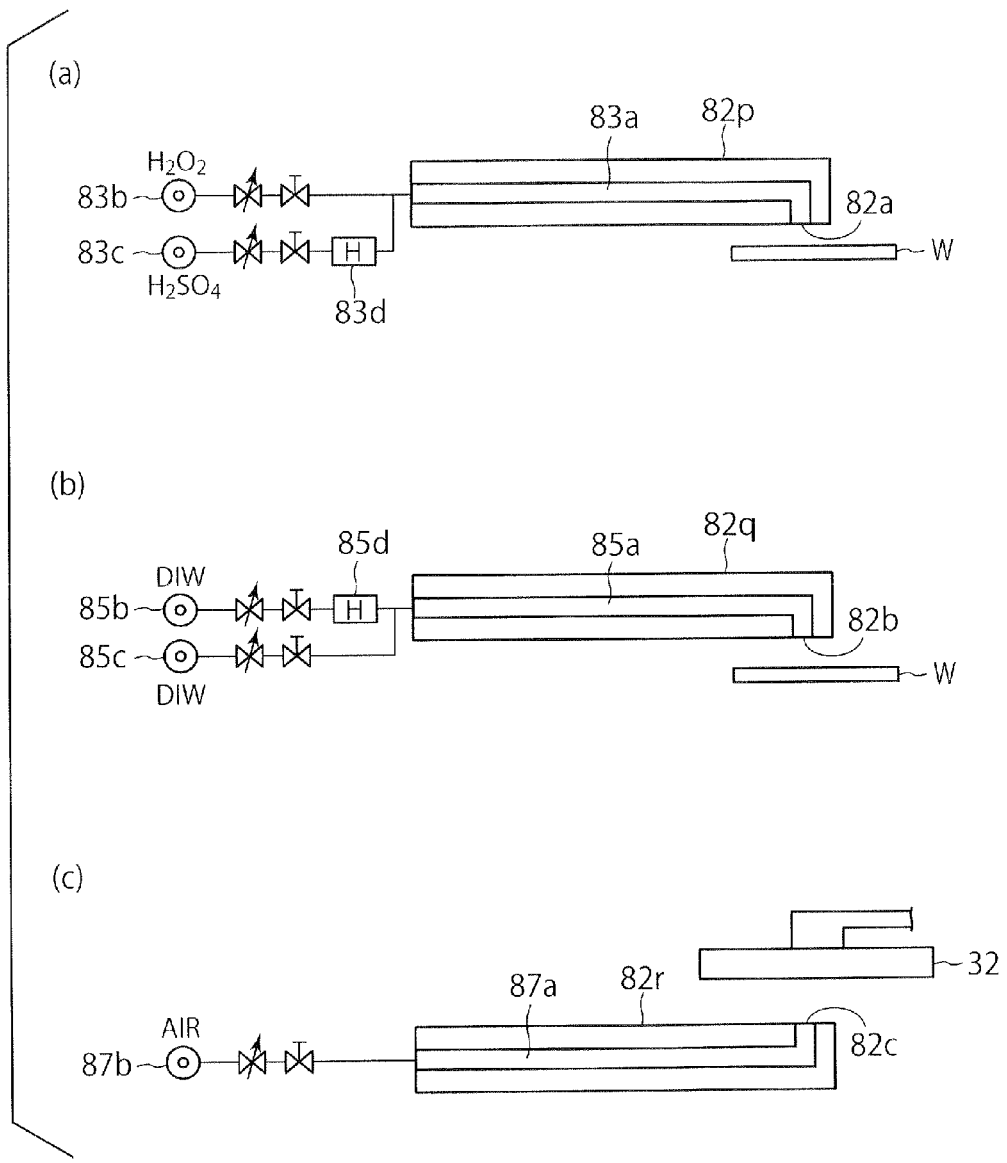
FIG. 8 shows diagrams illustrating configurations of nozzles and nozzle support arms in the liquid treatment apparatus shown in FIG. 2.

The nozzles 82a to 82c of the three nozzle support arms 82 (82p to 82r) are described in detail below with reference to FIG. 8.

As shown in FIG. 8(a), the nozzle (chemical liquid nozzle) 82a of the first nozzle support arm 82p (chemical liquid nozzle support arm) among the three nozzle support arms 82 faces downward. An SPM solution (chemical liquid) obtained by mixing sulfuric acid and hydrogen peroxide solution is discharged downward toward the wafer W from the nozzle 82a of the first nozzle support arm 82p. More specifically, a treatment liquid supply pipe 83a connected to the nozzle 82a is installed in the first nozzle support arm 82p. A hydrogen peroxide solution supply unit 83b and a sulfuric acid supply unit 83c that are arranged in parallel are connected to the treatment liquid supply pipe 83a through flow rate regulating valves and on-off valves, respectively. In addition, a heater 83d for heating the sulfuric acid supplied from the sulfuric acid supply unit 83c is provided. The hydrogen peroxide solution supplied from the hydrogen peroxide solution supply unit 83b and the sulfuric acid supplied from the sulfuric acid supply unit 83c are mixed with each other, and the SPM solution obtained by mixing the sulfuric acid and the hydrogen peroxide solution is delivered to the nozzle 82a of the first nozzle support arm 82p through the treatment liquid supply pipe 83a. In addition, while the sulfuric acid supplied from the sulfuric acid supply unit 83c is heated by the heater 83d, reaction heat is generated by a chemical reaction that occurs upon mixture of the sulfuric acid and the hydrogen peroxide solution. Thus, the temperature of the SPM solution discharged from the nozzle 82a of the first nozzle support arm 82p is high, for example, 100° C. or higher, preferably, approximately 170° C.

As shown in FIG. 8(b), the nozzle (rinse nozzle) 82b of the second nozzle support arm (rinse nozzle support arm) 82q among the three nozzle support arms 82 faces downward. A heated deionized water (rinse liquid) is discharged downward toward the wafer W from the nozzle 82b of the second nozzle support arm 82q. More specifically, a treatment liquid supply pipe 85a connected to the nozzle 82b is installed in the second nozzle support arm 82q. A deionized water supply unit 85b and a deionized water supply unit 85c that are arranged in parallel are connected to the treatment liquid supply pipe 85a through flow rate regulating valves and on-off valves, respectively. In addition, a heater 85d for heating the deionized water supplied from the deionized water supply unit 85b is provided. The deionized water supplied from the deionized water supply unit 85b is heated by the heater 85d, and the heated deionized water is delivered to the nozzle 82b of the second nozzle support arm 82q through the treatment liquid supply pipe 85a. The deionized water discharged from the nozzle 82b of the second nozzle support arm 82q has a temperature lower than that of the SPM solution discharged from the nozzle 82a of the first nozzle support arm 82p. Specifically, the temperature of the deionized water discharged from the nozzle 82b of the second nozzle support arm 82q is lower than 80° C., for example. A deionized water of a normal temperature having been supplied from the deionized water supply unit 85c can be delivered to the nozzle 82b of the second nozzle support arm 82q.

As shown in FIG. 8(c), the nozzle (replacement nozzle) 82c of the third nozzle support arm (replacement nozzle support arm) 82r among the three nozzle support arms 82 faces upward. An atmosphere replacement gas (e.g., air or $N_2$ gas) for replacing an atmosphere in the treatment space 30 is discharged upward above the wafer W from the nozzle 82c of the third nozzle support arm 82r. More specifically, a replacement gas supply pipe 87a connected to the nozzle 82c is installed in the third nozzle support arm 82r. A replacement gas supply unit 87b is connected to the replacement gas supply pipe 87a through a flow rate regulating valve and an on-off valve. The atmosphere replacement gas, such as air, supplied from the replacement gas supply unit 87b is delivered to the nozzle 82c of the third nozzle support arm 82r through the replacement gas supply pipe 87a.

In this embodiment, a height level of the third nozzle support arm (replacement nozzle support arm) 82r is higher than a height level of the second nozzle support arm (rinse nozzle support arm) 82q. Thus, when the third nozzle support arm 82r and the second nozzle support arm 82q simultaneously advance into the cylindrical outer cup 50, there is no possibility that the arms collide or interfere with each other. In this manner, the third nozzle support arm 82r and the second nozzle support arm 82q can simultaneously advance to the respective advanced positions in the cylindrical outer cup 50. Thus, a step of supplying the atmosphere replacement gas into the treatment space 30 by the nozzle 82c of the third nozzle support arm 82r and a step of supplying a deionized water onto a wafer W by the nozzle 82b of the second nozzle support arm 82q can be performed at the same time.

When the respective nozzle support arms 82 are located at the retracted positions, the tip portions of the nozzle support arms 82 close the corresponding side openings 50m of the cylindrical outer cup 50 located at the lifted position, such that the tip portions are close to the cylindrical outer cup to a degree so as not to interfere with the upward or downward movement of the cylindrical outer cup 50. This prevents an atmosphere in the cylindrical outer cup 50 from leaking through the side openings 50m to the outside of the cylindrical outer cup 50.

Figure 6:
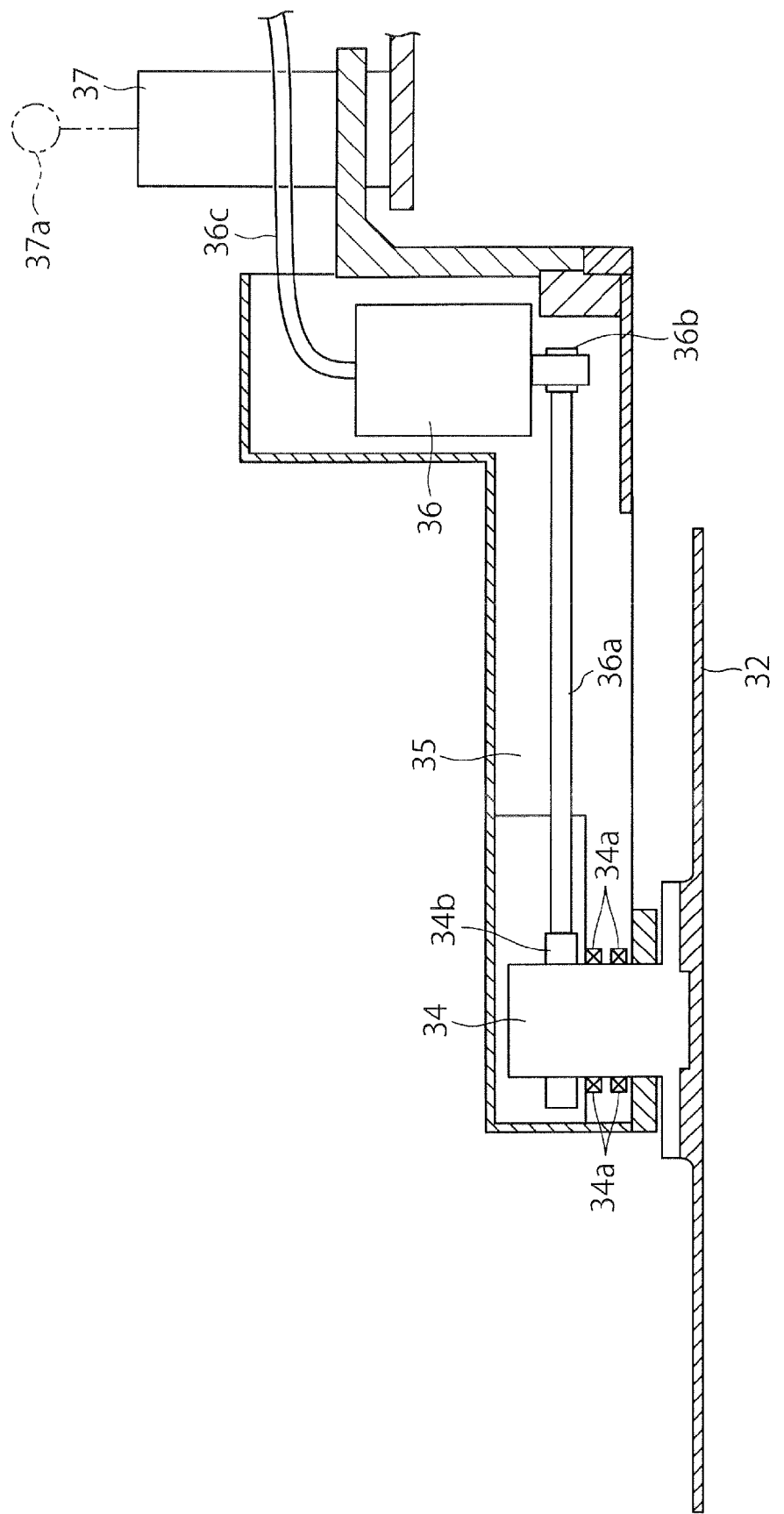
FIG. 6 is a vertical cross-sectional view of a top plate included in the liquid treatment apparatus shown in FIG. 2 and constituent elements located near the top plate.

Next, the detailed structures of the top plate 32 and constituent elements located near the top plate 32 are described with reference to FIG. 6. FIG. 6 is a sectional side view showing configurations of the top plate 32 and the constituent elements located near the top plate 32.

As shown in FIG. 6, the top plate 32 is held by a top plate holding arm 35. A rotary shaft 34 is attached to an upper portion of the top plate 32, while a bearing 34a is arranged between the rotary shaft 34 and the top plate holding arm 35. Thus, the rotary shaft 34 can rotate with respect to the top plate holding arm 35. A pulley 34b is attached to the rotary shaft 34. A servo motor 36 is attached to a proximal portion of the top plate holding arm 35, while a pulley 36b is attached to the tip portion of the servo motor 36. An endless timing belt 36a is wound around the pulley 34b of the rotary shaft 34 and the pulley 36b of the servo motor 36. Rotary drive force generated by the servo motor 36 is transmitted to the rotary shaft 34 by the timing belt 36a, whereby the top plate 32 rotates around the rotary shaft 34. A cable 36c is connected to the servo motor 36. Electric power is supplied from the outside of a housing of the liquid treatment apparatus 10 through the cable 36c to the servo motor 36. The rotary shaft 34, the timing belt 36a, the servo motor 36 and so on form a top plate rotation mechanism for rotating the top plate 32 in a horizontal plane.

As shown in FIGS. 4 and 6, a pivot shaft 37 is arranged at the proximal end of the top plate holding arm 35, and a top plate pivoting drive unit 37a is connected to the pivot shaft 37. Thus, the top plate holding arm 35 pivots around the pivot shaft 37. Due to this structure, the top plate 32 reciprocately moves between the advanced position, which is indicated by the solid line shown in FIG. 4, at which the top plate 32 covers the wafer W held by the substrate holder 21 from above and the retracted position, which is indicated by the two-dot chain lines shown in FIG. 4, at which the top plate 32 is retracted from the advanced position in the horizontal direction and then located.

An external diameter of the top plate 32 is slightly smaller than an internal diameter of the cylindrical outer cup 50. When the top plate 32 has been moved to the advanced position and the cylindrical outer cup 50 is then moved up from the lowered position to the lifted position, an upper end of the cylindrical outer cup 50 is moved up to a position slightly higher than the top plate 32. Thus, the top plate 32 is accommodated in the cylindrical outer cup 50.

As shown in FIGS. 2 and 4, a top plate storage unit 38 for storing the top plate 32 when the top plate 32 is retracted to the retracted position is installed in the standby area 80 of the liquid treatment apparatus 10. The top plate storage unit 38 has an opening formed in a side portion thereof. When the top plate 32 moves from the advanced position to the retracted position, the top plate 32 is entirely housed in the top plate storage unit 38 through the side opening of the top plate storage unit 38. In addition, an evacuation unit 39 is arranged under the top plate storage unit 38. An atmosphere in the top plate storage unit 38 is evacuated at all times by the evacuation unit 39. Even in a case where liquid droplets of the treatment liquid such as the SPM solution adheres to the lower surface of the top plate 32 during the liquid treatment of the wafer W, when the top plate 32 is stored in the top plate storage unit 38, an atmosphere of the treatment liquid such as the SPM solution is evacuated by the evacuation unit 39. Thus, the atmosphere of the treatment liquid does not flow into the standby area 80 and the chamber 20.

Figure 7:
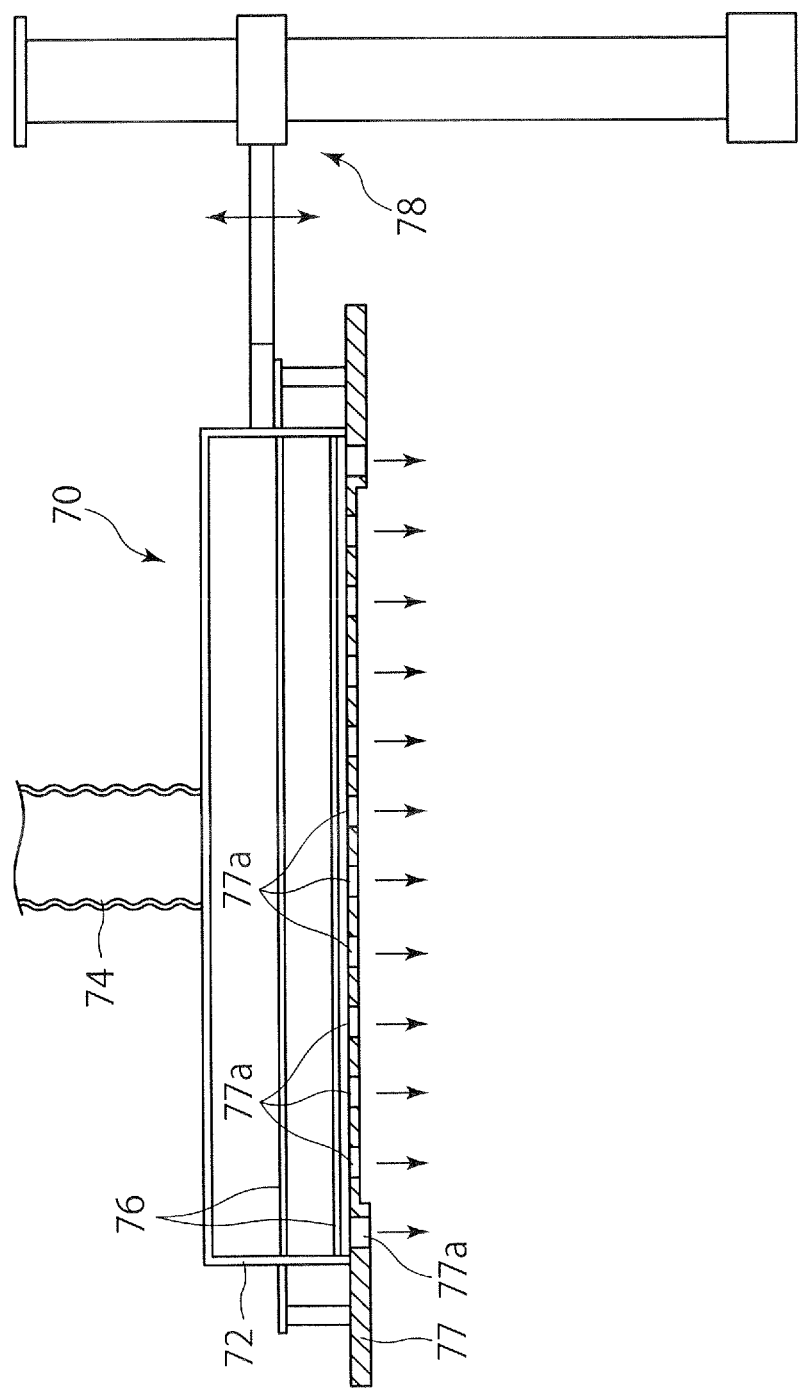
FIG. 7 is a vertical cross-sectional view of an air hood included in the liquid treatment apparatus shown in FIG. 2 and constituent elements located near the air hood.

Next, the detailed structures of the air hood 70 and constituent elements located near the air hood 70 are described with reference to FIG. 7. FIG. 7 is a sectional side view showing configurations of the air hood 70 and the constituent elements located near the air hood 70.

As shown in FIG. 7, the air hood 70 includes a casing 72 having a lower opening and a lower plate 77 having a plurality of apertures 77a, which may be a punching plate or the like, arranged at the lower portion of the casing 72. One or more filters 76 are arranged in the casing 72. In addition, a flexible duct 74 is connected to an upper portion of the casing 72. The duct 74 communicates with an environment outside the housing of the liquid treatment apparatus 10. A fan (not shown) for drawing a gas into the casing 72 is arranged at a proximal end portion of the duct 74. The lower plate 77 has the apertures 77a allowing the gas within the casing 72 to flow downward. Thus, after the gas has been delivered from the environment outside the housing of the liquid treatment apparatus 10 through the duct 74 into the casing 72 and particles contained in the gas have been removed by the filter 76 in the casing 72, the cleaned gas flows downward from the apertures 77a of the lower plate 77.

As shown in FIG. 7, an air hood lifting mechanism 78 for moving up and down the air hood 70 is installed for the air hood 70. By the air hood lifting mechanism 78, the air hood 70 is moved up and down between the lowered position at which the air hood 70 covers the wafer W held by the substrate holder 21 and the lifted position located above the lowered position. As described above, FIG. 2 shows the state in which the air hood 70 is located at the lifted position.

As illustrated in FIG. 2, the liquid treatment apparatus 10 has a controller 200 for controlling overall operations of the liquid treatment apparatus 10. The controller 200 controls operations of all the functional parts (substrate holder 21, piston mechanism 24, servo motor 36, air hood lifting mechanism 78 and the like) of the liquid treatment apparatus 10. The controller 200 can be realized by a general-purpose computer serving as hardware and programs (apparatus control program, treatment recipes and the like) serving as software used to operate the computer. The software is stored in a storage medium such as a hard disk drive fixed to and included in the computer or is stored in a removable storage medium (such as a CD-ROM, DVD, and flash memory) set in the computer. The storage medium is indicated by a reference numeral 201 in FIG. 2. A processor 202 calls a predetermined treatment recipe from the storage medium 201 and executes the called treatment recipe on the basis of an instruction from a user interface (not illustrated) when necessary, and whereby functional parts of the liquid treatment apparatus 10 operate under control of the controller 200 and a predetermined treatment is performed. The controller 200 may be a system controller for controlling the overall liquid treatment system illustrated in FIG. 1.

Next, a series of steps of a cleaning treatment for removing an unnecessary resist film on the upper surface of the wafer W by using the liquid treatment apparatus 10 described above is described with reference to FIG. 9 and FIG. 10. The series of steps of the cleaning treatment described below is performed by causing the controller 200 to control the operations of the functional parts of the liquid treatment apparatus 10.

First, as shown in FIG. 9(a), the top plate 32 is moved to the retracted position, and the top plate 32 is stored into the top plate storage unit 38. In addition, the air hood 70 is moved down from the lifted position, which is shown in FIG. 2, to be located at the lowered position. Furthermore, the cylindrical outer cup 50 is moved to the lowered position so as to open the side portion of the substrate holder 21. In this state, the opening 94a is opened by moving up the lift pin plate 22 and the treatment liquid supply pipe 28 of the substrate holder 21 from the position shown in FIG. 5, and by retracting the shutter 94 disposed on the opening 94a of the chamber 20 from the opening 94a. Then, the wafer W is carried into the chamber 20 by the carrying arm 104 from the outside of the liquid treatment apparatus 10 through the opening 94a and placed on the lift pins 23 of the lift pin plate 22. After that, the carrying arm 104 is retracted from the chamber 20. At this time, the respective nozzle support arms 82 are located at the retracted positions at which the nozzle support arms 82 are retracted from the chamber 20. Namely, the nozzle support arms 82 stand by in the standby area 80. A gas such as clean air is delivered in a down flow at all times from the air hood 70 into the chamber 20. By discharging the gas, an atmosphere in the chamber 20 is replaced. In the respective following steps described below, the gas is continuously delivered in a down flow.

Then, the lift pin plate 22 and the treatment liquid supply pipe 28 are moved downward to be located at the lowered positions as shown in FIG. 5. At this time, the holding members 25 arranged on the holding plate 26 hold the wafer W placed on the lift pins 23 from the lateral side of the wafer W, and take the wafer W slightly apart from the lift pins 23. In this manner, the wafer W is held in a horizontal posture by the substrate holder 21.

Thereafter or after the lift pin plate 22 has been moved down, as shown in FIG. 9(b), the air hood 70 is moved from the lowered position to the lifted position. After that, the top plate 32 is moved from the retracted position to the advanced position. Thus, the wafer W held by the substrate holder 21 is covered by the top plate 32. After the top plate 32 has been moved to the advanced position, as shown in FIG. 9(c), the cylindrical outer cup 50 is moved up from the lowered position to be located at the lifted position. More specifically, the top plate 32 is accommodated in the cylindrical outer cup 50 such that the upper end of the cylindrical outer cup 50 is located at a position slightly higher than the top plate 32. Thus, there is defined around the wafer W the treatment space 30 that covers the wafer W by the top plate 32 and the cylindrical outer cup 50 and is isolated from the outside. Thereafter, by providing rotary drive force from the servo motor 36 to the top plate 32, the top plate 32 is rotated about the rotary shaft 34 in the horizontal plane.

After the cylindrical outer cup 50 has been moved to the lifted position, the first nozzle support arm (chemical liquid nozzle support arm) 82p among the three nozzle support arms 82 standing by in the standby area 80 advances into the chamber 20 through the corresponding side opening 50m of the cylindrical outer cup 50 (refer to FIG. 9(d)). In this case, the first nozzle support arm 82p is moved linearly.

Then, the holding plate 26 and the lift pin plate 22 of the substrate holder 21 are rotated. Thus, the wafer W held by the respective holding members 25 of the holding plate 26 rotates. While the wafer W is rotating, the SPM solution is supplied onto the upper surface of the wafer W from the nozzle (chemical liquid nozzle) 82a of the first nozzle support arm 82p that has advanced into the cylindrical outer cup 50. The SPM solution supplied onto the upper surface of the wafer W has a high temperature of 100° C. or higher, for example, preferably approximately 170° C. In this manner, in the treatment space 30, the SPM solution is supplied onto the upper surface of the wafer W, so that the wafer W is subjected to an SPM treatment (chemical liquid treatment). In the chemical liquid treatment, a resist on the upper surface of the wafer W is peeled off by the SPM solution. Due to the centrifugal force of the rotating wafer W, the peeled resist, together with the SPM solution, scatters around in the radial direction of the wafer W so as to be delivered to and collected by the exhaust unit 46. By moving the nozzle 82a of the first nozzle support arm 82p, which discharges the SPM solution to the wafer W, in the right and left direction in FIG. 9(d), the SPM solution can be uniformly supplied to the whole area of the wafer W.

During the SPM treatment performed to the wafer W, since the treatment space 30 is defined inside the top plate 32 and the cylindrical outer cup 50, an atmosphere in the treatment space 30 can be prevented from flowing to the outside. In addition, since the top plate 32 is rotated in the horizontal plane, liquid droplets of the treatment liquid, such as the SPM solution, which adhere to the top plate 32, are directed to an inner wall surface of the cylindrical outer cup 50 due to the centrifugal force. Since the liquid droplets fall down by their own weights along the inner wall surface of the cylindrical outer cup 50, re-adhesion of the liquid droplets of the treatment liquid, such as the SPM solution, to the wafer W can be suppressed.

Following thereto, when the SPM treatment to the wafer W is finished, as shown in FIG. 9(e), the first nozzle support arm 82p that has advanced into the cylindrical outer cup 50 retracts from the chamber 20 and stands by in the standby area 80. At this time, the wafer W and the top plate 32 are continuously rotated. In addition, during the movement of the first nozzle support arm 82p from the cylindrical outer cup 50 to the retracted position, the first nozzle support arm 82p is cleaned by the arm cleaning unit 88. Thus, contamination such as the SPM solution adhering to the first nozzle support arm 82p can be removed.

Figure 11:
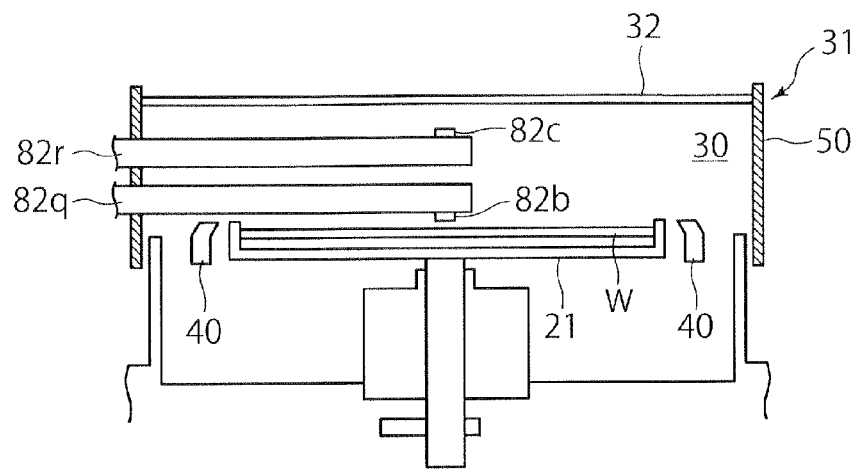
FIG. 11 is a side view showing an inside of a treatment space upon an atmosphere replacement step performed by the liquid treatment apparatus shown in FIG. 2.

Then, the second nozzle support arm (rinse nozzle support arm) 82q among the three nozzle support arms 82 standing by in the standby area 80 advances into the chamber through the corresponding side opening 50m of the cylindrical outer cup 50 (refer to FIG. 9(f)). In this case, the second nozzle support arm 82q is moved linearly. Simultaneously with the second nozzle support arm 82q, the third nozzle support arm (replacement nozzle support arm) 82r advances into the chamber 20 through the corresponding side opening 50m of the cylindrical outer cup 50. In this case, the third nozzle support arm 82r is moved linearly. The height level of the third nozzle support arm 82r is higher than the height level of the second nozzle support arm 82q. Thus, when the third nozzle support arm 82r and the second nozzle support arm 82q simultaneously advance into the cylindrical outer cup 50, there is no possibility that the arms collide or interfere with each other (refer to FIG. 11). As a result, as described below, it is possible to simultaneously perform a step of supplying a heated deionized water onto the wafer W by the nozzle (rinse nozzle) 82b of the second nozzle support arm 82q so as to subject the wafer W to a hot rinse treatment, and a step of supplying an atmosphere replacement gas into the treatment space 30 by the nozzle (replacement nozzle) 82c of the third nozzle support arm 82r so as to replace the atmosphere in the treatment space 30.

While the wafer W and the top plate 32 are being rotated, a heated deionized water (e.g., 80° C.) is supplied toward the center of the wafer W from the nozzle 82b of the second nozzle support arm 82q that has advanced into the cylindrical outer cup 50. At this time, the heated deionized water (rinse liquid) is supplied toward the lower surface (back surface) of the wafer W from the treatment liquid supply pipe 28. In this manner, the hot rinse treatment is performed to the wafer W.

While the hot rinse treatment is performed, the nozzle 82c of the third nozzle support arm 82r that has advanced into the cylindrical outer chamber 50 supplies, above the wafer W, the atmosphere replacement gas into the treatment space 30. At this time, the nozzle 82c discharges the atmosphere replacement gas upward, so that the atmosphere in the treatment space 30 is exhausted, together with the deionized water scattering around in the radial direction of the wafer W due to the centrifugal force of the rotating wafer W, by the exhaust unit 46 disposed on the bottom portion of the drain cup 42. Thus, the atmosphere in the treatment space 30 is replaced with the atmosphere replacement gas.

After the hot rinse treatment to the wafer W has been finished, the third nozzle support arm 82r retracts from the cylindrical outer chamber 50 to move to the retracted position. At this time, the third nozzle support arm 82r is cleaned by the arm cleaning unit 88. Thus, contamination adhering to the third nozzle support arm 82r can be removed.

Then, while the wafer W and the top plate 32 are being rotated, a deionized water of a normal temperature is supplied toward the center of the wafer W from the nozzle 82b of the second nozzle support arm 82q that has advanced into the cylindrical outer cup 50. At this time, the deionized water of a normal temperature is supplied toward the lower surface (back surface) of the wafer W from the treatment liquid supply pipe 28. In this manner, a rinse treatment is performed to the wafer W.

After the rinse treatment to the wafer W has been finished, as shown in FIG. 10(g), the second nozzle support arm 82q retracts from the cylindrical outer chamber 50 to move to the retracted position. At this time, the second nozzle support arm 82q is cleaned by the arm cleaning unit 88. Thus, contamination adhering to the second nozzle support arm 82q can be removed. After that, the wafer W is rotated at a high speed, so that wafer W is subjected to a drying treatment in the treatment space 30.

After the drying treatment to the wafer W has been finished, as shown in FIG. 10(h), the rotation of the top plate 32 is stopped and the cylindrical outer cup 50 is moved down from the lifted position to be located at the lowered position. When the cylindrical outer cup 50 is moved to the lowered position, the cylindrical outer cup 50 is immersed in the cleaning liquid contained in the reservoir unit 52a of the cleaning unit 52. Thus, the cylindrical outer cup 50 is cleaned, whereby it is possible to prevent the liquid droplets of the treatment liquid, such as the SPM solution, which have scattered during the SPM treatment of the wafer W, from remaining on the inner wall of the cylindrical outer cup 50.

Then, as shown in FIG. 10(i), the top plate 32 is moved from the advanced position to the retracted position, and the top plate 32 is housed into the top plate storage unit 38. An atmosphere in the top plate storage unit 38 is evacuated at all times by the evacuation unit 39. Thus, even if the liquid droplets of the treatment liquid, such as the SPM solution, adhere to the lower surface of the top plate 32 during the SPM treatment of the wafer W, the atmosphere of the treatment liquid such as the SPM solution is evacuated by the evacuation unit 39 when the top plate 32 is housed into the top plate storage unit 38. Therefore, the atmosphere of the SPM solution does not flow into the standby area 80 and the chamber 20.

Then, as shown in FIG. 10(j), the air hood 70 is moved down from the lifted position to be located at the lowered position, so that the side portion of the substrate holder 21 is opened. After that, the rotation of the wafer W is stopped, and the opening 94a is opened by moving up the lift pin plate 22 and the treatment liquid supply pipe 28 of the substrate holder 21 from the position shown in FIG. 5, and by retracting the shutter 94 disposed on the opening 94a of the chamber 20 from the opening 94a. Then, the carrying arm 104 moves into the chamber 20 from the outside of the liquid treatment apparatus 10 through the opening 94a, and the wafer W placed on the lift pins 23 of the lift pin plate 22 is transferred to the carrying arm 104. Thereafter, the wafer W having been taken out by the carrying arm 104 is carried to the outside of the liquid treatment apparatus 10. In this manner, the series of liquid treatments to the wafer W are completed.

According to this embodiment, after the SPM treatment to the wafer W has been performed in the treatment space 30, the hot rinse treatment to the wafer W is performed in the treatment space 30. While the hot rinse treatment is performed, the atmosphere replacement gas is supplied into the treatment space 30 by the nozzle (replacement nozzle) 82c. Thus, the atmosphere in the treatment space 30 can be efficiently replaced with the atmosphere replacement gas. In addition, the atmosphere in the treatment space 30 is exhausted by the exhaust unit 46, the atmosphere in the treatment space 30 can be more efficiently replaced. As a result, upon the hot rinse treatment, the fume, which was generated by the SPM treatment to remain in the treatment space 30, can be promptly removed from the treatment space 30. Thus, the treatment space 30 can be opened shortly after the SPM treatment, a following step can be performed immediately. For this reason, a time required for the liquid treatment of the wafer W can be reduced as a whole.

In addition, according to this embodiment, the nozzle 82c of the third nozzle support arm (replacement nozzle support arm) 82r discharges the atmosphere replacement gas upward. Further, the exhaust unit 46 is disposed on the bottom portion of the drain cup 42 located around the wafer W. Namely, the atmosphere replacement gas is supplied to the upper part of the treatment space 30, and the atmosphere in the treatment space 30 is evacuated from the lower part of the treatment space 30. Thus, the atmosphere in the treatment space 30 can be efficiently replaced. Since the atmosphere replacement gas is discharged upward, the atmosphere replacement gas hits the top plate 32 so as to be diffused in the treatment space 30, whereby the atmosphere in the treatment space 30 can be efficiently replaced with the atmosphere replacement gas. In particular, the atmosphere replacement gas discharged upward can be more reliably diffused in the treatment space 30 by a turning flow generated by the rotation of the top plate 32, whereby the atmosphere in the treatment space 30 can be more efficiently replaced. Moreover, in this case, since the atmosphere replacement gas is not blown directly onto a liquid film of the deionized water formed on the wafer W, the liquid film can be prevented from being disturbed.

In addition, according to this embodiment, the third nozzle support arm 82r supporting the nozzle 82c that supplies the atmosphere displacement gas is configured to be horizontally moved between the advanced position at which the third nozzle support arm 82r is advanced into the treatment space 30, and the retracted position at which the nozzle support arm 82r is retracted outside from the treatment space 30. Thus, in a step other than the step of supplying the atmosphere replacement gas, the third nozzle support arm 82r can be retracted to be located at the retracted position, whereby it is possible to prevent that contamination such as fume adheres to the third nozzle support arm 82r.

In addition, according to this embodiment, when the cylindrical outer cup 50 is located at the lifted position and the top plate 32 is located at the advanced position, the treatment space 30 where the SPM treatment to the wafer W is performed is defined. When the SPM treatment is performed to the wafer W, since the closed treatment space 30 is defined inside the top plate 32 and the cylindrical outer cup 50, the atmosphere including fume in the treatment space 30 can be prevented from leaking outside and diffusing in the chamber 20.

In addition, according to this embodiment, the height level of the third nozzle support arm (replacement nozzle support arm) 82r is higher than the height level of the second nozzle support arm (rinse nozzle support arm) 82q. Thus, when the third nozzle support arm 82r and the second nozzle support arm 82q simultaneously advance into the cylindrical outer cup 50, there is no possibility that the arms collide or interfere with each other. Namely, the third nozzle support arm 82r and the second nozzle support arm 82q can be simultaneously advanced into the treatment space 30, whereby the atmosphere in the treatment space 30 can be replaced, during the hot rinse treatment of the wafer W. Therefore, the fume remaining in the treatment space 30 can be prevented from diffusing from the treatment space 30 to the chamber 20, as well as the liquid treatment steps of the wafer W can be reduced as a whole.

In addition, according to this embodiment, the arm cleaning unit 88 is provided outside the cylindrical outer cup 50. Thus, after the atmosphere replacement step in the treatment space 30 has been finished, the third nozzle support arm 82r can be cleaned while the third nozzle support arm 82r is moved from the advanced position to the retracted position, whereby contamination such as fume adhering to the third nozzle support arm 82r can be removed. Further, when the third nozzle support arm 82r is advanced from the retracted position to the advanced position, the third nozzle support arm 82r can be cleaned by the arm cleaning unit 88. Thus, the clean third nozzle support arm 82r free of contamination such as fume can be advanced to the advanced position in the treatment space 30, to thereby further improve the replacement efficiency of the atmosphere in the treatment space 30.

The liquid treatment apparatus in this embodiment is not limited to the above, and can be variously modified.

For example, in this embodiment, the high-temperature treatment liquid is not limited to the SPM solution. Other chemical liquids may be used as the high-temperature treatment liquid as long as a fume is generated from the treatment liquid. As the other chemical liquids, a mixed liquid containing sulfuric acid and nitric acid, a mixed liquid containing sulfuric acid and buffered hydrofluoric acid (BHF), and a mixed liquid containing sulfuric acid and diluted buffered hydrofluoric acid (BHF) may be used.

Figure 12:
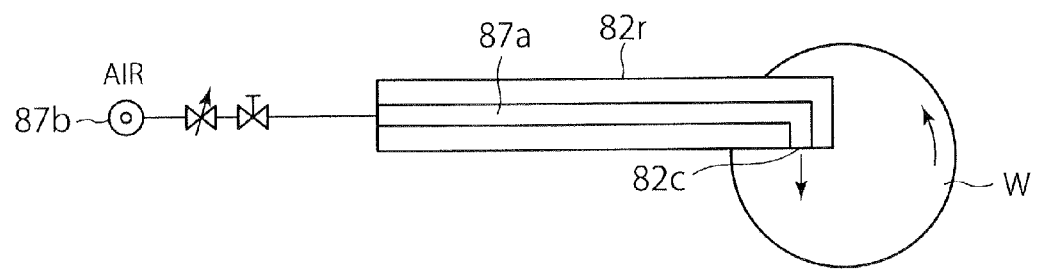
FIG. 12 shows a diagram illustrating another configuration of the nozzles and the nozzle support arms shown in FIG. 8.

In addition, the nozzle 82c of the third nozzle support arm 82r is not limited to the structure by which the atmosphere replacement gas is discharged upward. For example, as shown in FIG. 12, the nozzle 82c may be configured to horizontally discharge the atmosphere replacement gas in the rotating direction of the wafer W. In this case, since the discharged atmosphere replacement gas flows with a turning flow generated by the rotation of the wafer W, the atmosphere in the treatment space 30 can be efficiently replaced.

Figure 13:
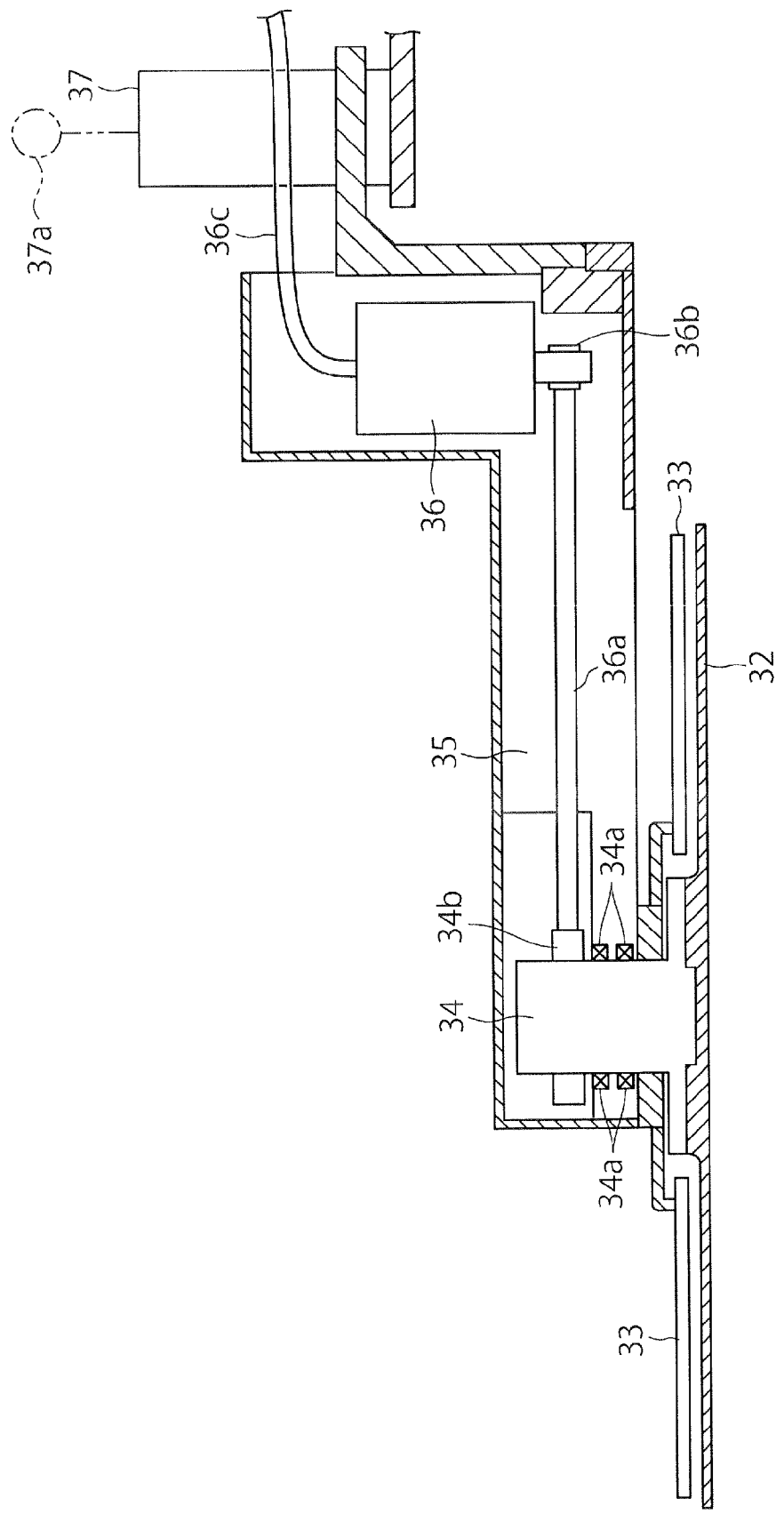
FIG. 13 is a vertical cross-sectional view showing another configuration of the top plate of the liquid treatment apparatus shown in FIG. 2.

In addition, as shown in FIG. 13, as a top plate heating mechanism for heating the top plate 32, an LED lamp 33 may be provided on the tap plate holding arm 35. The LED lamp 33 is not rotated, while the top plate 32 is rotated. As described above, the SPM solution is discharged onto the upper surface of the wafer W in order to remove the resist film disposed on the upper surface of the wafer W. The higher the temperature of the SPM solution is, the higher the ability of the SPM solution for removing the resist film becomes. In order thereto, the LED lamp 33 is located near the top plate 32 so as to heat the top plate 32 by the LED lamp 33. Thus, the atmosphere around the wafer W held by the substrate holder 21 is heated, so that the SPM solution discharged onto the upper surface of the wafer W is heated. Owing thereto, the ability of the SPM solution for removing the resist film can be improved. In addition, even when the SPM solution adheres to the lower surface of the top plate 32, the SPM solution can be evaporated by the LED lamp 33. When the SPM solution is heated to increase its temperature, a larger amount of fume may be generated and the fume may remain in the treatment space 30. However, even in this case, since the atmosphere in the treatment space 30 can be efficiently replaced upon the hot rinse treatment, the fume can be rapidly removed from the treatment space 30.

Figure 14:
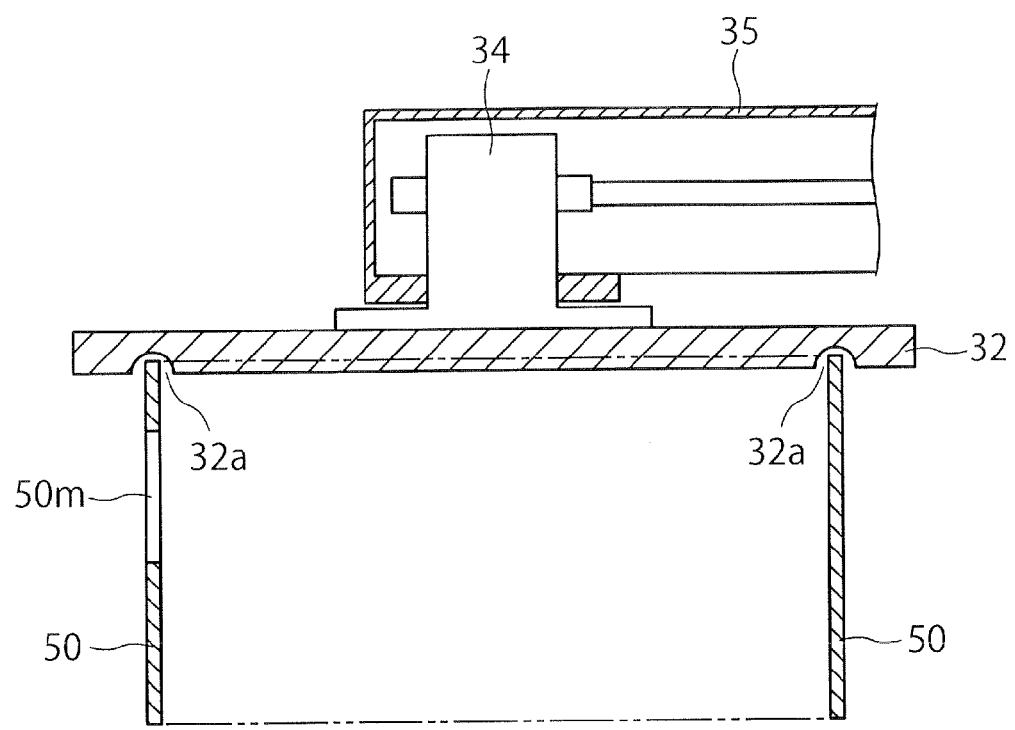
FIG. 14 is a vertical cross-sectional view showing other configurations of the top plate and a cylindrical outer cup included in the liquid treatment apparatus shown in FIG. 2.

In addition, as shown in FIG. 14, the external diameter of the top plate 32 may be larger than the internal diameter of the cylindrical outer cup 50. In this case, a groove 32a is formed in the lower surface of the top plate 32. When the top plate 32 is moved to the advanced position and then the cylindrical outer cup 50 is moved up from the lowered position to the lifted position, the upper end of the cylindrical outer cup 50 is received in the groove 32a formed in the lower surface of the top plate 32. Even in this case, the treatment space 30 isolated from outside can be defined around the wafer W by the top plate 32 and the outer cylindrical cup 50.

Figure 15:
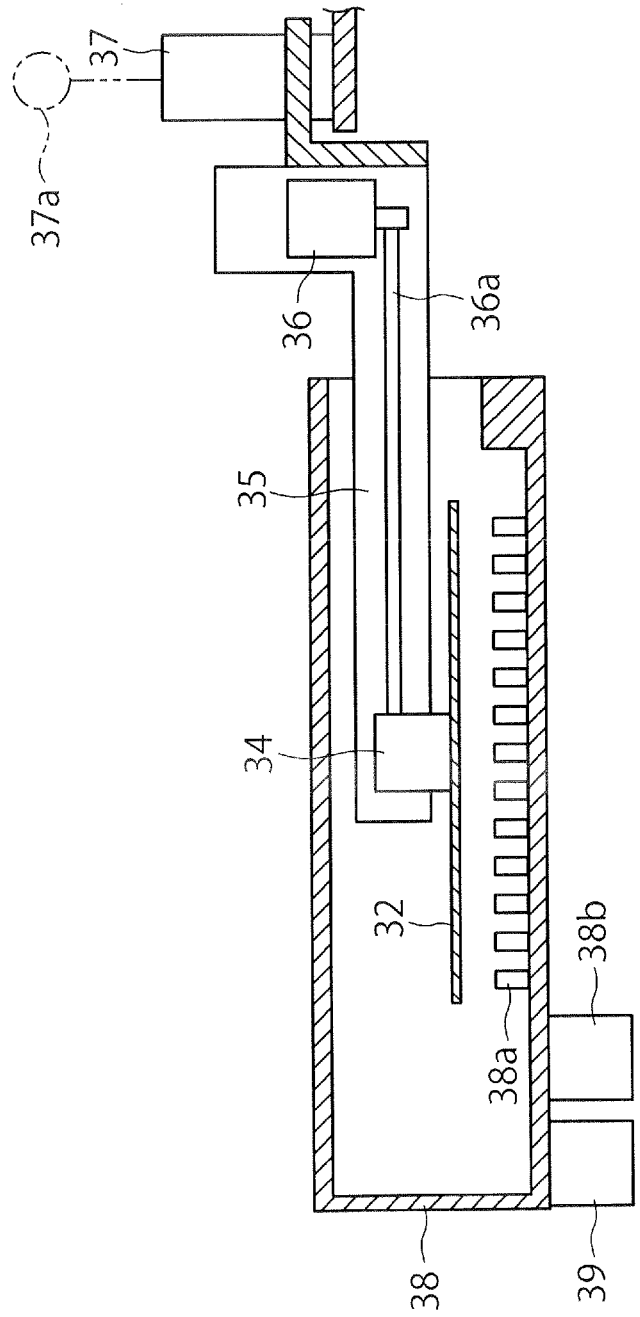
FIG. 15 is a vertical cross-sectional view showing another configuration of a top plate storage unit included in the liquid treatment apparatus shown in FIG. 2.

In addition, as shown in FIG. 15, the top plate storage unit 38 may be provided with a top plate cleaning mechanism 38a for cleaning the top plate 32 stored in the top plate storage unit 38. Specifically, the top plate cleaning mechanism 38a is formed of a plurality of nozzles facing upward. A cleaning liquid such as a deionized water is discharged upward from the respective nozzles. When the top plate 32 is stored in the top plate storage unit 38, the cleaning liquid is discharged upward from the respective nozzles of the top plate cleaning mechanism 38a, so that the lower surface of the top plate 32 is cleaned. The top plate storage unit 38 is also provided with a drain unit 38b. The cleaning liquid such as a deionized water supplied to the top plate 32 from the respective nozzles of the top plate cleaning mechanism 38a is drained by the drain unit 38b.

In addition, in this embodiment, there is described the example in which the respective nozzle support arms 82 supporting the three nozzles 82a to 82c are horizontally moved between the advanced position in the cylindrical outer cup 50 and the retracted position retracted from the advanced position. However, in place of such a structure, a nozzle (chemical nozzle) 82a for supplying the SPM solution to the wafer W may be arranged on the lower surface of the top plate 32. In this case, installation of the nozzle 82a for supplying the SPM solution and the nozzle support arm (chemical nozzle support arm) 82 supporting the nozzle 82a can be omitted.

(Second Embodiment)

Next, the liquid treatment system including the liquid treatment apparatus in a second embodiment of the present invention is described with reference to FIGS. 16 and 17.

Figure 16:
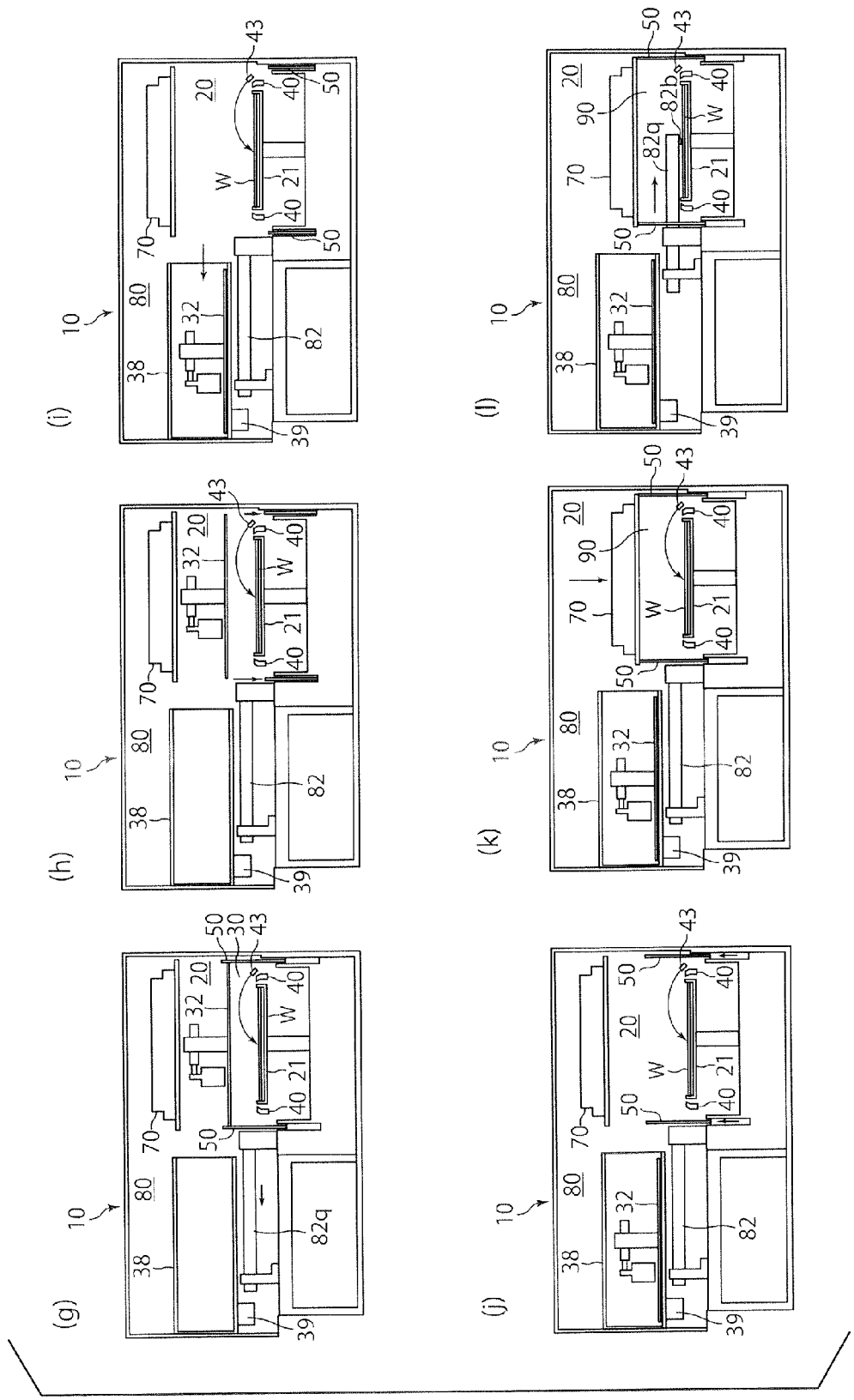
FIG. 16(g) to FIG. 16(l) are diagrams describing a series of steps of the wafer cleaning treatment in a second embodiment of the present invention.
Figure 17:
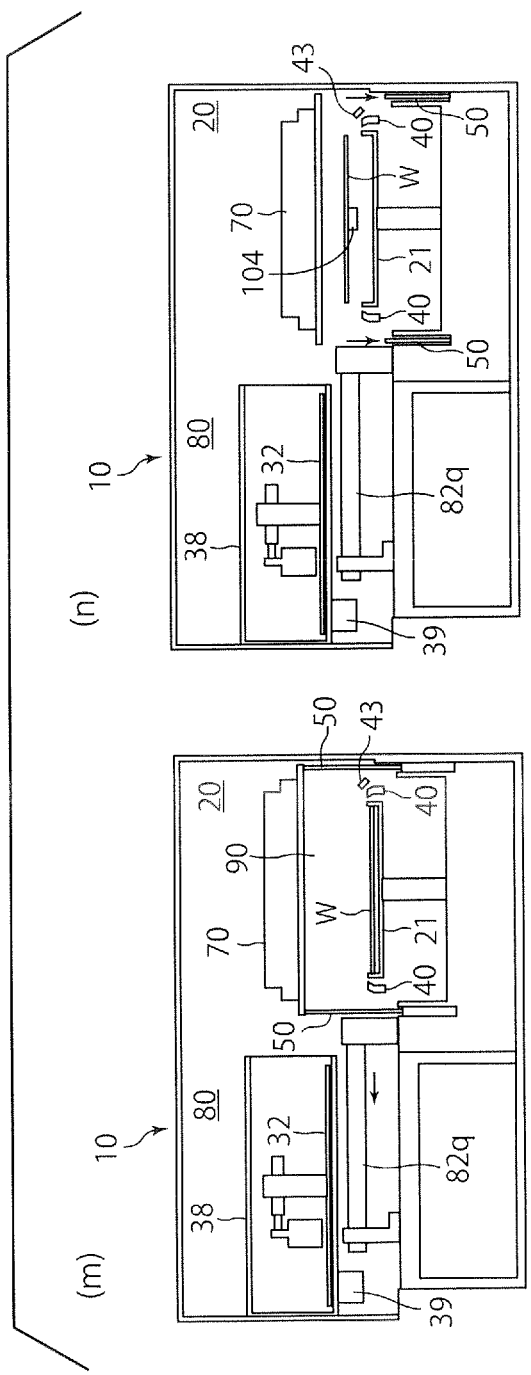
FIG. 17(m) and FIG. 17(n) are diagrams describing a series of steps of the wafer cleaning treatment in the second embodiment of the present invention.

The second embodiment shown in FIGS. 16 and 17 mainly differs from the first embodiment shown in FIGS. 1 to 15 in that a rinse treatment using a deionized water of a normal temperature and a drying treatment are performed in a second treatment space defined by the cylindrical outer cup 50 and the air hood 70. Other structures of the second embodiment are substantially the same as those of the first embodiment. In FIGS. 16 and 17, the same parts as those of the first embodiment are shown by the same reference numbers, and detailed description thereof is omitted.

Figure 9:
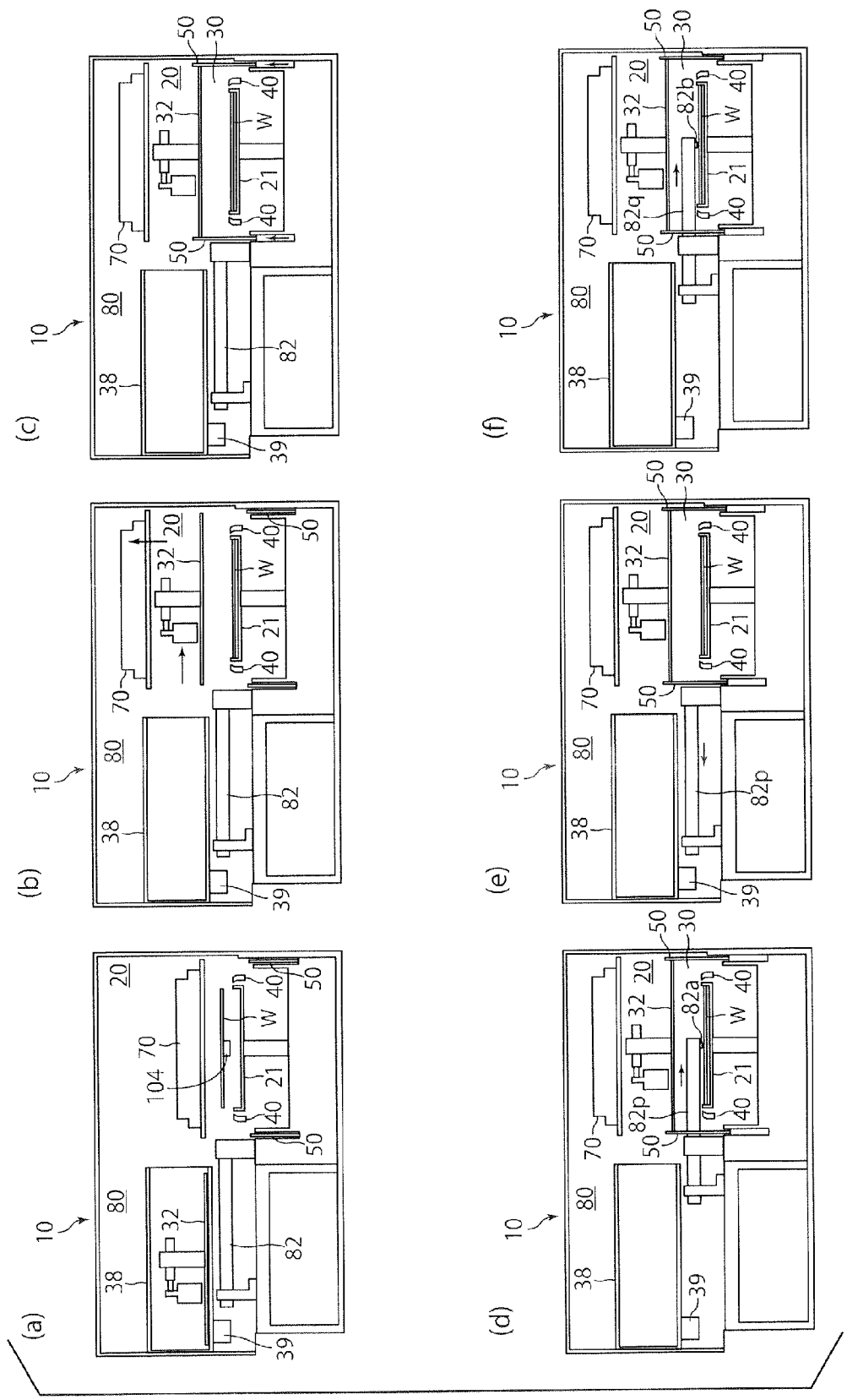
FIG. 9(a) to FIG. 9(f) are diagrams describing a series of steps of a wafer cleaning treatment that is performed by the liquid treatment apparatus shown in FIG. 2.
Figure 10:
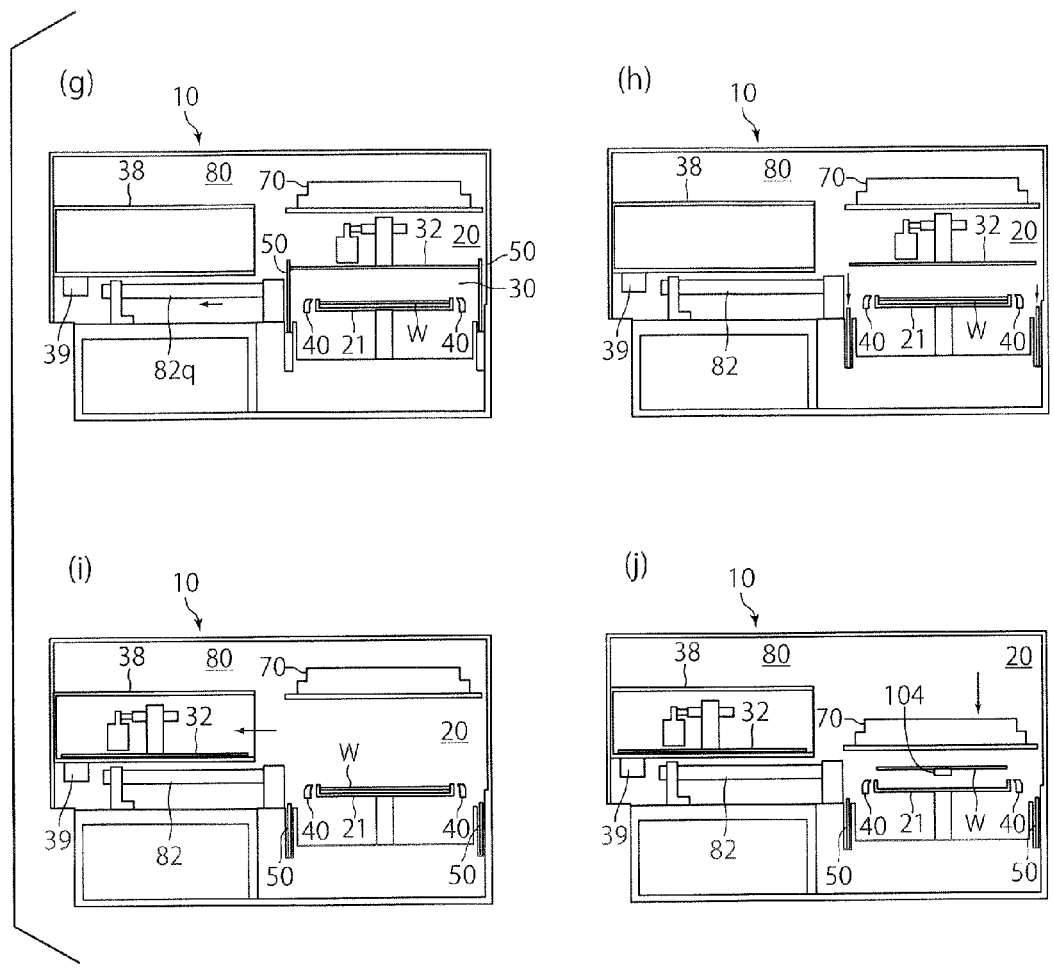
FIG. 10(g) to FIG. 10(j) are diagrams describing a series of steps of the wafer cleaning treatment that is performed by the liquid treatment apparatus shown in FIG. 2.

In this embodiment, after the hot rinse treatment to the wafer W (refer to FIG. 9(*f*)) has been finished, as shown in FIG. 16(*g*), the second nozzle support arm (rinse nozzle support arm) 82*q* that has advanced into the cylindrical outer cup 50 retracts from the cylindrical outer cup 50 and stands by in the standby area 80. At this time, the wafer W is continuously rotated. When the second nozzle support arm 82*q* retracts from the cylindrical outer cup 50 to move to the retracted position, the second nozzle support arm 82*q* is cleaned by the arm cleaning unit 88. Thus, contamination adhering to the second nozzle support arm 82*q* can be removed. In addition, before the second nozzle support arm 82*q* retracts from the cylindrical outer cup 50, a deionized water (e.g., 80° C.) is supplied toward the center of the wafer W from a fixed rinse nozzle 43. Since a liquid film is formed on the surface of the wafer W by the fixed rinse nozzle 43, the surface of the wafer W is not exposed, whereby it is possible to prevent that particles adhere to the surface of the wafer W.

Then, as shown in FIG. 16(*h*), the rotation of the top plate 32 is stopped, and the cylindrical outer cup 50 is moved down from the lifted position to be located at the lowered position. At this time, the fixed rinse nozzle 43 continuously supplies a deionized water (e.g., 80° C.) toward the center of the wafer W. When the cylindrical outer cup 50 is moved to the lowered position, the cylindrical outer cup 50 is immersed in the cleaning liquid contained in the reservoir unit 52*a* of the cleaning unit 52. Thus, the cylindrical outer cup 50 is cleaned, whereby liquid droplets of the treatment liquid, such as the SPM solution, which have scattered during the SPM treatment of the wafer W, can be prevented from remaining on the inner wall of the cylindrical outer cup 50.

Thereafter, as shown in FIG. 16(*i*), the top plate 32 is moved from the advanced position to the retracted position, so that the top plate 32 is housed in the top plate storage unit 38. An atmosphere in the top plate storage unit 38 is evacuated at all times by the evacuation unit 39. Thus, even if the liquid droplets of the treatment liquid, such as the SPM solution, adhere to the lower surface of the top plate 32 during the SPM treatment of the wafer W, the atmosphere of the treatment liquid such as the SPM solution is evacuated by the evacuation unit 39 when the top plate 32 is housed into the top plate storage unit 38. Therefore, the atmosphere of the SPM solution does not flow into the standby area 80 and the chamber 20.

Then, as shown in FIG. 16(*j*), the cylindrical outer cup 50 having been cleaned by the cleaning unit 52 is moved up from the lowered position to be located at the lifted position. At this time, the fixed rinse nozzle 43 continuously supplies a deionized water (e.g., 80° C.) toward the center of the wafer W. Thereafter, as shown in FIG. 16(*k*), the air hood 70 is moved down from the lifted position to be located at the lowered position. More specifically, the upper end of the cylindrical outer cup 50 is brought into contact with or close to the lower surface of the lower plate 77 of the air hood 70. Thus, around the wafer W, there is defined a second treatment space 90 that covers the wafer W by the air hood 70 and the cylindrical outer cup 50 and is isolated from outside. As described below, the second treatment space 90 is a space where a gas cleaned by the air hood 70 flows downward.

After that, the second nozzle support arm 82*q* among the three nozzle support arms 82 standing by in the standby area 80 advances into the chamber 20 through the side opening 50*m* of the cylindrical outer cup 50 (refer to FIG. 16(*l*)). At this time, the second nozzle support arm 82*q* is moved linearly. Under a state in which the wafer W is rotated and the gas cleaned by the air hood 70 flows in the second treatment space 90, a deionized water of a normal temperature is supplied toward the center of the wafer W from the nozzle 82*b* of the second nozzle support arm 82*q* that has advanced into the cylindrical outer cup 50. At this time, the deionized water of a normal temperature is supplied from the treatment liquid supply pipe 28 toward the lower surface (back surface) of the wafer W. Thus, the wafer W is subjected to the rinse treatment.

After the rinse treatment to the wafer W has been finished, as shown in FIG. 17(*m*), the second nozzle support arm 82*q*, which has advanced into the cylindrical outer cup 50, retracts from the cylindrical outer cup 50 and stands by in the standby area 80. In addition, when the second nozzle support arm 82*q* retracts from the cylindrical outer cup 50 to move to the retracted position, the second nozzle support arm 82*q* is cleaned by the arm cleaning unit 88. Thus, contamination adhering to the second nozzle support arm 82*q* can be removed. After the second nozzle support arm 82*q* has retracted from the cylindrical outer cup 50, the gas cleaned by the air hood 70 continuously flows in the second treatment space 90. After that, the wafer W is rotated at a high speed, so that the wafer W is subjected to the drying treatment in the second treatment space 90.

After the drying treatment to the wafer W has been finished, as shown in FIG. 17(*n*), the cylindrical outer cup 50 is moved down from the lifted position to be located at the lowered position, so that the side portion of the substrate holder 21 is opened. After that, the rotation of the wafer W is stopped, and the opening 94*a* is opened by moving up the lift pin plate 22 and the treatment liquid supply pipe 28 of the substrate holder 21 from the position shown in FIG. 5, and by retracting the shutter 94 disposed on the opening 94*a* of the chamber 20 from the opening 94*a*. Then, the carrying arm 104 moves into the chamber 20 from the outside of the liquid treatment apparatus 10 through the opening 94*a*, and the wafer W placed on the lift pins 23 of the lift pin plate 22 is transferred to the carrying arm 104. Thereafter, the wafer W having been taken out by the carrying arm 104 is carried to the outside of the liquid treatment apparatus 10. In this manner, the series of liquid treatments to the wafer W are completed.

According to this embodiment, during the hot rinse treatment to the wafer W, the atmosphere in the treatment chamber 30 is replaced, whereby the fume can be removed from the treatment space 30. After the hot rinse treatment, the treatment space 30 is opened so as to define the second treatment space 90 by the cylindrical outer cup 50 and the air hood 70. In the second treatment space 90, the rinse treatment using a deionized water of a normal temperature and the drying treatment can be performed. That is to say, since a down flow of clean air from the air hood 70 is made to flow downward toward the upper surface of the wafer W, particles floating above the wafer W can be prevented from adhering to the wafer W during the rinse treatment and the drying treatment. Therefore, various treatments can be performed without contaminating the wafer W.

The invention claimed is:

1. A liquid treatment apparatus comprising:
a substrate holder configured to horizontally hold a substrate;
a top plate configured to be rotatable and to cover the substrate held by the substrate holder from above so as to define a treatment space;
a chemical liquid nozzle configured to supply a chemical liquid to the substrate in the treatment space;
a replacement nozzle configured to supply an atmosphere replacement gas into the treatment space; and
a replacement nozzle support arm configured to support the replacement nozzle and configured to be horizontally moved between an advanced position at which the replacement nozzle support arm is advanced into the treatment space and a retracted position at which the replacement nozzle support arm is retracted outside from the treatment space;

wherein the replacement nozzle is configured to discharge, above the substrate, the atmosphere replacement gas upward.

2. The liquid treatment apparatus according to claim 1, wherein the atmosphere replacement gas supplied by the replacement nozzle into the treatment space is air or nitrogen gas.

3. The liquid treatment apparatus according to claim 1, the chemical liquid supplied by the chemical liquid nozzle onto the substrate is a mixed liquid containing sulfuric acid and hydrogen peroxide solution.

4. The liquid treatment apparatus according to claim 1, further comprising:

a top plate pivoting drive unit configured to move the top plate between an advanced position at which the substrate held by the substrate holder is covered from above, and a retracted position which is retracted horizontally from the advanced position;

a cylindrical outer cup arranged around the substrate held by the substrate holder in a radial direction of the substrate, the cylindrical outer cup including an upper opening that is closed by the top plate; and a vertically driving unit configured to move up and down the cylindrical outer cup between a lifted position and a lowered position located lower than the lifted position.

5. The liquid treatment apparatus according to claim 4, wherein an arm cleaning unit is arranged outside the cylindrical outer cup, the arm cleaning unit being configured to clean the replacement nozzle support arm when the replacement nozzle support arm is moved from the advanced position to the retracted position or when moved from the retracted position to the advanced position.

6. The liquid treatment apparatus according to claim 4, wherein a side opening is formed in a side surface of the cylindrical outer cup, and when the cylindrical outer cup is located at the lifted position, the replacement nozzle support arm is configured to be horizontally moved between the advanced position and the retracted position through the side opening of the cylindrical outer cup.

7. The liquid treatment apparatus according to claim 6, wherein:

the two side openings are formed in the side surface of the cylindrical outer cup;

the liquid treatment apparatus further comprises:

a rinse nozzle configured to supply a rinse liquid to the substrate held by the substrate holder in the treatment space; and a rinse nozzle support arm configured to support the rinse nozzle and configured to be horizontally moved, when the cylindrical outer cup is located at the lifted position, between an advanced position at which the rinse nozzle support arm is advanced into the cylindrical outer cup and a retracted position at which the rinse nozzle support nozzle is retracted outside from the cylindrical outer cup, through the corresponding side opening of the cylindrical outer cup;

a height level of the replacement nozzle support arm is higher than a height level of the rinse nozzle support arm; and the replacement nozzle support arm and the rinse nozzle support arm are capable of being advanced simultaneously to the respective advanced positions in the cylindrical outer cup.

8. A liquid treatment apparatus comprising:

a substrate holder configured to horizontally hold a substrate;

a substrate rotary drive unit configured to rotate the substrate holder;

a top plate configured to be rotatable and to cover the substrate held by the substrate holder from above so as to define a treatment space;

a chemical liquid nozzle configured to supply a chemical liquid to the substrate in the treatment space;

a replacement nozzle configured to supply an atmosphere replacement gas into the treatment space; and a replacement nozzle support arm configured to support the replacement nozzle and configured to be horizontally moved between an advanced position at which the replacement nozzle support arm is advanced into the treatment space and a retracted position at which the replacement nozzle support arm is retracted outside from the treatment space;

wherein the replacement nozzle is configured to discharge, above the substrate, the atmosphere replacement gas horizontally in a rotating direction of the substrate.

9. A liquid treatment method comprising:

holding a substrate in a horizontal posture;

covering an upper part of the held substrate with a top plate so as to define a treatment space;

rotating the top plate after having defining the treatment space;

performing a chemical liquid treatment onto the substrate by supplying a chemical liquid to the substrate in the treatment space;

moving a replacement nozzle configured to supply an atmosphere replacement gas into the treatment space where the chemical liquid treatment has been performed, from a position that is retracted outside from the treatment space to a position that is advanced into the treatment space; and supplying the atmosphere replacement gas into the treatment space from the replacement nozzle that has advanced into the treatment space so as to replace an atmosphere in the treatment space with the atmosphere replacement gas.

10. The liquid treatment method according to claim 9, further comprising performing a rinse treatment of the substrate by supplying a rinse liquid onto the substrate having been subjected to the chemical liquid treatment in the treatment space, wherein the rinse treatment and the replacement of the atmosphere in the treatment space with the atmosphere replacement gas are simultaneously performed.

11. The liquid treatment method according to claim 9, wherein:

after the replacement of the atmosphere in the treatment space with the atmosphere replacement gas, the replacement nozzle is horizontally moved from the advanced position to the retracted position; and during the horizontal movement, a replacement nozzle support arm supporting the replacement nozzle is cleaned by an arm cleaning unit arranged outside the treatment space.

12. The liquid treatment method according to claim 9, wherein in the replacement of the atmosphere in the treatment space with the atmosphere replacement gas, the atmosphere replacement gas supplied to the treatment space is air or nitrogen gas.

13. The liquid treatment method according to claim 9, wherein in the chemical liquid treatment of the wafer, the chemical liquid supplied onto the substrate is a mixed liquid containing sulfuric acid and hydrogen peroxide solution.

14. The liquid treatment method according to claim 9, wherein in the replacement of the atmosphere in the treatment space with the atmosphere replacement gas, the replacement nozzle discharges, above the substrate, the atmosphere replacement gas upward.

15. The liquid treatment method according to claim 9, wherein the substrate is rotated in the treatment space after the holding of the substrate in a horizontal posture, and in the replacement of the atmosphere in the treatment space with the atmosphere replacement gas, the replacement nozzle discharges the atmosphere replacement gas horizontally in a rotating direction of the rotating substrate.

* * * * *